(12) United States Patent
Hatakeyama et al.

(10) Patent No.: US 7,449,277 B2
(45) Date of Patent: Nov. 11, 2008

(54) POSITIVE RESIST COMPOSITIONS AND PATTERNING PROCESS

(75) Inventors: Jun Hatakeyama, Joetsu (JP); Takeshi Nagata, Joetsu (JP); Takanobu Takeda, Joetsu (JP)

(73) Assignee: Shin-Etsu Chemical C., Ltd, Tokyo (JP)

( * ) Notice: Subject to any disclaimer, the term of this patent is extended or adjusted under 35 U.S.C. 154(b) by 0 days.

(21) Appl. No.: 11/523,792

(22) Filed: Sep. 20, 2006

(65) Prior Publication Data

US 2007/0072115 A1    Mar. 29, 2007

(30) Foreign Application Priority Data

Sep. 21, 2005  (JP) .............. 2005-274163
Apr. 18, 2006  (JP) .............. 2006-114084

(51) Int. Cl.
*G03F 7/039* (2006.01)
*G03F 7/30* (2006.01)
*G03C 1/00* (2006.01)

(52) U.S. Cl. ............ 430/270.1; 430/907; 430/281.1; 430/286.1; 430/326; 522/156; 522/154

(58) Field of Classification Search ............ 430/270.1, 430/907; 522/156, 154
See application file for complete search history.

(56) References Cited

U.S. PATENT DOCUMENTS

| | | | |
|---|---|---|---|
| 4,491,628 A | 1/1985 | Ito et al. | |
| 4,822,719 A * | 4/1989 | Schneller et al. | ......... 430/270.1 |
| 5,310,619 A | 5/1994 | Crivello et al. | |
| 6,200,725 B1 | 3/2001 | Takechi et al. | |
| 6,280,898 B1 | 8/2001 | Hasegawa et al. | |
| 6,448,420 B1 | 9/2002 | Kinsho et al. | |
| 6,746,818 B2 | 6/2004 | Kinsho et al. | |
| 6,806,026 B2 * | 10/2004 | Allen et al. | ......... 430/270.1 |
| 2001/0026901 A1 | 10/2001 | Maeda et al. | |
| 2004/0038150 A1 | 2/2004 | Bae et al. | |
| 2005/0282083 A1 * | 12/2005 | Funatsu et al. | ......... 430/270.1 |
| 2006/0105267 A1 * | 5/2006 | Khojasteh et al. | ......... 430/270.1 |

FOREIGN PATENT DOCUMENTS

| | | | |
|---|---|---|---|
| JP | 63-27829 A | | 2/1988 |
| JP | 2-27660 B2 | | 6/1990 |
| JP | 9-73173 A | | 3/1997 |
| JP | 9-90637 A | | 4/1997 |
| JP | 9-230595 A | | 9/1997 |
| JP | 10-10739 A | | 1/1998 |
| JP | 2000-026446 A | | 1/2000 |
| JP | 2000-159758 A | | 6/2000 |
| JP | 2000-327633 A | | 11/2000 |
| JP | 2002-107933 A | | 4/2002 |
| JP | 2002-371114 A | | 12/2002 |
| JP | 2004-163877 A | | 6/2004 |
| WO | WO 97/33198 A1 | | 9/1997 |

OTHER PUBLICATIONS

Takeshi Okino et al.; "Resists Using the Absorption Band Shift Method for ArF Excimer Laser Lithography"; Journal of Photopolymer Science and Technology, vol. 11, No. 3, 1998, pp. 489-492.

* cited by examiner

*Primary Examiner*—Cynthia H. Kelly
*Assistant Examiner*—Ponder N Thompson Rummel
(74) *Attorney, Agent, or Firm*—Westerman, Hattori, Daniels & Adrian, LLP.

(57) ABSTRACT

A polymer is obtained from (meth)acrylate having a bridged ring lactone group, (meth)acrylate having an acid-labile leaving group, and (meth)acrylate having a hydroxynaphthyl pendant. A positive resist composition comprising the polymer as a base resin, when exposed to high-energy radiation and developed, exhibits a high sensitivity, a high resolution, and a minimal line edge roughness due to controlled swell during development, and leaves minimal residues following development.

14 Claims, No Drawings

POSITIVE RESIST COMPOSITIONS AND PATTERNING PROCESS

CROSS-REFERENCE TO RELATED APPLICATION

This non-provisional application claims priority under 35 U.S.C. §119(a) on Patent Application Nos. 2005-274163 and 2006-114084 filed in Japan on Sep. 21, 2005 and Apr. 18, 2006, respectively, the entire contents of which are hereby incorporated by reference.

TECHNICAL FIELD

This invention relates to positive resist compositions, typically of the chemical amplification type, adapted for exposure to high-energy radiation, which have a significantly high contrast of alkali dissolution rate before and after the exposure, a high sensitivity, a high resolution, a minimal line edge roughness, and good etching resistance, and which are especially suited as micropatterning materials for the manufacture of VLSI or the formation of photomask patterns; and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, passed through the 0.25 micron rule, and currently entered the mass production phase on the 0.18 micron rule. Engineers have started investigation on the 0.15 micron rule, with the trend toward a finer pattern rule being accelerated. A wavelength change-over from KrF to shorter wavelength ArF excimer laser (193 nm) is expected to enable miniaturization of the design rule to 0.13 µm or less. Since conventionally used novolac resins and polyvinylphenol resins have very strong absorption in proximity to 193 nm, they are difficult to use as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

Among others, a focus is drawn on (meth)acrylic resin base resists featuring a high resolution. One of the (meth)acrylic resins proposed thus far is a combination of (meth)acrylic units having methyladamantane ester as acid labile group units with (meth)acrylic units having lactone ring ester as adhesive group units as disclosed in JP-A 9-90637. Norbornyl lactone is also proposed as an adhesive group having enhanced etching resistance as disclosed in JP-A 2000-26446, JP-A 2000-159758 and JP-A 2002-371114.

Of the outstanding tasks associated with the ArF lithography, it is desired to minimize line edge roughness and to reduce residues following development. One of the factors causing line edge roughness is swelling during development. While the polyhydroxystyrene used as the resist for KrF lithography, in which the phenol moiety is a weak acidic group and has an appropriate alkali solubility, is resistant to swelling, polymers containing hydrophobic cycloaliphatic groups, which must be dissolved using carboxylic acids having a high acidity, are likely to swell during development.

Naphthalene ring is an aromatic having less absorption at wavelength 193 nm. ArF resist compositions based on vinyl naphthalene copolymers are described in J. Photopolym. Sci. Technol., Vol. 11, No. 3, p 489 (1998), JP-A 2004-163877, and JP-A 2002-107933. Since hydroxy-containing naphthalene rings exhibit weak acidity like phenol, they are expected to be effective in preventing swelling during development. Another advantage of naphthalene ring is high etching resistance.

SUMMARY OF THE INVENTION

An object of the invention is to provide a positive resist composition which when exposed to high-energy radiation and developed, exhibits a high sensitivity, a high resolution, and a minimal line edge roughness due to controlled swell during development, and leaves minimal residues following development. Another object of the invention is to provide a process for forming a pattern using the same.

In a first aspect, the invention provides a positive resist composition comprising a polymer comprising recurring units of the general formulae (a) and (b).

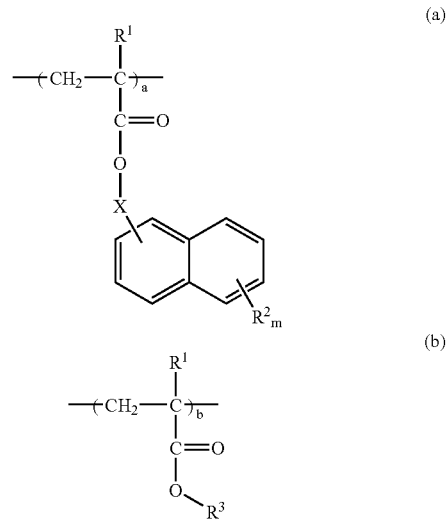

Herein $R^1$ is each independently hydrogen or methyl. $R^2$ is a hydroxy group, acid labile group-substituted hydroxy group, carboxyl group, or acid labile group-substituted carboxyl group. $R^3$ is an acid labile group or lactone-containing adhesive group. X is a single bond or a straight or branched alkylene group of 1 to 6 carbon atoms which may have an ester (—COO—) group or ether (—O—) group. The subscript m is 1 or 2, a and b are numbers in the range: $0<a<1.0$ and $0<b\leq0.8$.

Preferred is a polymer comprising recurring units of the general formula (c) in addition to recurring units of the general formulae (a) and (b).

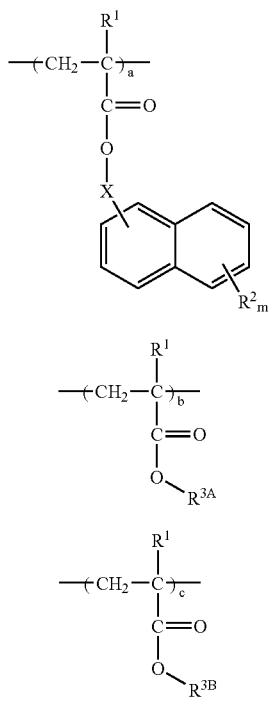

Herein $R^1$, $R^2$ and X are as defined above. $R^{3A}$ is a lactone-containing adhesive group, and $R^{3B}$ is an acid labile group. The subscript m is 1 or 2, a, b and c are numbers in the range: $0<a<1.0$, $0\leq b\leq 0.8$, $0\leq c\leq 0.8$, and $0<b+c\leq 0.8$.

When exposed to high-energy radiation and developed, the positive resist composition comprising the above polymer as a base resin has a significantly high contrast of alkali dissolution rate before and after the exposure, a high sensitivity, a high resolution, and a minimal line edge roughness due to controlled swell during development, leaves minimal residues following etching, and exhibits good etching resistance. Owing to these advantages, the composition is fully acceptable in industrial practice and especially suited as a micropatterning material for the manufacture of VLSI or the formation of photomask patterns.

The composition is preferably formulated as a chemically amplified positive resist composition comprising (A) the above polymer as a base resin, (B) an organic solvent, and (C) a photoacid generator. With this formulation, in the exposed area, the rate of dissolution of the polymer in a developer liquid is accelerated by acid-catalyzed reaction. Then the chemically amplified positive resist composition has so high a sensitivity that it is very suitable as the micropatterning material which is currently needed for the manufacture of VLSI. The positive resist composition may further include a dissolution inhibitor. The inclusion of a dissolution inhibitor enhances the difference in dissolution rate between the exposed and unexposed areas, leading to a further improvement in resolution. The positive resist composition may further include a basic compound and/or a surfactant. The addition of a basic compound holds down the rate of diffusion of acid within the resist film, leading to a further improvement in resolution. The addition of a surfactant improves or controls the applicability of the resist composition.

A pattern may be formed on a semiconductor substrate or mask substrate using the resist composition of the invention, typically by applying the resist composition onto a substrate to form a coating, heat treating the coating, exposing it to high-energy radiation, and developing it with a developer liquid. Heat treatment may also be carried out after the exposure and before the development. The process may, of course, be followed by various steps such as etching, resist removal and cleaning steps. The high-energy radiation typically has a wavelength of up to 200 nm. The resist composition containing the inventive polymer as the base resin is especially effective for exposure to high-energy radiation with a wavelength of up to 200 nm because its sensitivity to the exposure wavelength in the range is very high.

BENEFITS OF THE INVENTION

The positive resist compositions of the invention have many advantages including a high sensitivity, a high resolution, minimized line edge roughness, minimal residues following development, and controlled swell during development. There are thus provided positive resist compositions, especially chemically amplified positive resist compositions, which are suited as micropatterning materials for the manufacture of VLSI or the formation of photomask patterns.

DESCRIPTION OF THE PREFERRED EMBODIMENTS

The inventors continued research works targeting a positive resist composition which when exposed to high-energy radiation and developed, exhibits a high sensitivity, a high resolution, and a minimal line edge roughness due to controlled swell during development, and leaves minimal residues following development.

Polyhydroxystyrene used in the KrF excimer laser lithography, which has phenol groups with an appropriate acidity, is characterized by minimal swell in an alkaline developer liquid. At the wavelength of 193 nm, benzene ring cannot be used because of its very strong absorption. Instead, it was proposed to use vinylnaphthalene having an absorption maximum shifted toward the longer wavelength side. Albeit less absorption than styrene, vinylnaphthalene still has a noticeable absorption above the level for use in resist compositions, and so the proportion of incorporation is limited and the resist film must be thin.

As the problem that resist patterns collapse following development becomes serious, an approach for thin resist film is in progress. For the 45-nm generation of lithography, a film thickness equal to or less than 150 nm is considered, but a concomitant drop of etching resistance becomes serious. An increase of line edge roughness is also observed concomitantly with the film thickness reduction. With the progress of thin resist film, greater absorption of resist compositions is rather advantageous in avoiding inverse-tapered profiles. Also, in the case of implant resist compositions which are used with highly reflective substrates, it is necessary to reduce the transmittance positively in order to suppress substrate reflection. In the prior art, increasing the amount of photoacid generator (PAG) added is effective for transmittance reduction. However, an increase of the PAG addition amount beyond the necessity leads to losses of characteristics including a lowering of etching resistance, a lowering of resolution due to enhanced acid diffusion, and an enlargement of proximity bias.

Intending to incorporate phenolic hydroxyl groups, the inventors have made a study to incorporate (meth)acrylate having a hydroxynaphthyl group as the adhesive group. The inventors have discovered that when it is further copolymerized with recurring units having lactone as the adhesive group, the resulting copolymer is endowed with a good balance of hydrophilicity, alkaline solubility and adhesion. In particular, when a polymer which is obtained from a combination of (meth)acrylate having a bridged ring lactone group, (meth)acrylate having an acid-labile leaving group, and (meth)acrylate having a hydroxynaphthyl pendant as an adhesive group is used as the base resin, there is provided a positive resist composition which when exposed to high-energy radiation and developed, exhibits a high sensitivity, a high resolution, and a minimal line edge roughness due to controlled swell during development, and leaves minimal residues following development. The composition also has excellent dry etching resistance.

Polymer

The positive resist composition of the invention comprises a polymer or high molecular weight compound comprising recurring units of the general formulae (a) and (b).

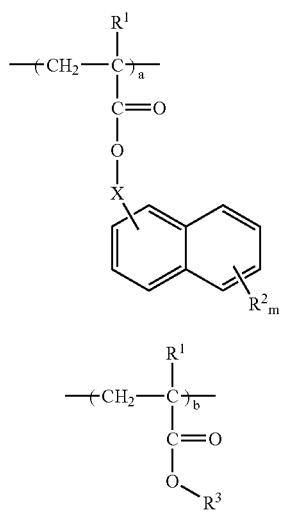

Herein $R^1$ which may be the same or different is hydrogen or methyl. $R^2$ is a hydroxy group, an acid labile group-substituted hydroxy group, a carboxyl group, or an acid labile group-substituted carboxyl group. $R^3$ is an acid labile group or a lactone-containing adhesive group. X is a single bond or a straight or branched alkylene group of 1 to 6 carbon atoms which may have an ester (—COO—) group or ether (—O—) group. The subscript m is 1 or 2, a and b are numbers in the range: $0<a<1.0$ and $0<b\leq 0.8$.

In a preferred embodiment, the polymer further comprises recurring units of the general formula (c). That is, the preferred polymer comprises recurring units of the general formulae (a), (b), and (c).

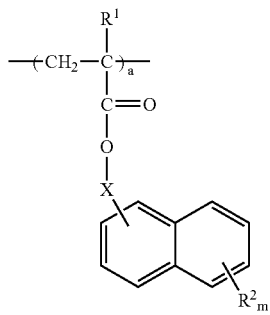

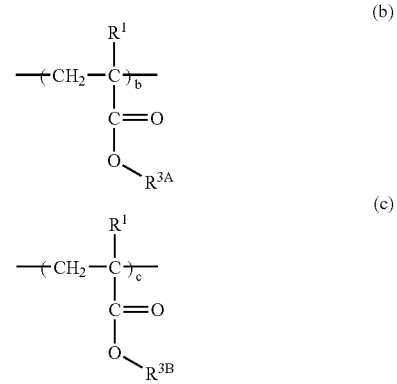

Herein $R^1$ which may be the same or different is hydrogen or methyl. $R^2$ is a hydroxy group, an acid labile group-substituted hydroxy group, a carboxyl group, or an acid labile group-substituted carboxyl group. $R^{3A}$ is a lactone-containing adhesive group, and $R^{3B}$ is an acid labile group. X is a single bond or a straight or branched alkylene group of 1 to 6 carbon atoms which may have an ester group or ether group. The subscript m is 1 or 2, a, b and c are numbers in the range: $0<a<1.0$, $0\leq b\leq 0.8$, $0\leq c\leq 0.8$, and $0<b+c\leq 0.8$.

When exposed to high-energy radiation and developed, the positive resist composition comprising the above polymer as a base resin has a significantly high contrast of alkali dissolution rate before and after the exposure, a high sensitivity, a high resolution, and a minimal line edge roughness due to controlled swell during development, leaves minimal residues following etching, and exhibits good etching resistance. Owing to these advantages, the composition is fully acceptable in industrial practice and especially suited as a micropatterning material for the manufacture of VLSI or the formation of photomask patterns.

Examples of the monomers "a" from which the recurring units of formula (a) are derived are given below.

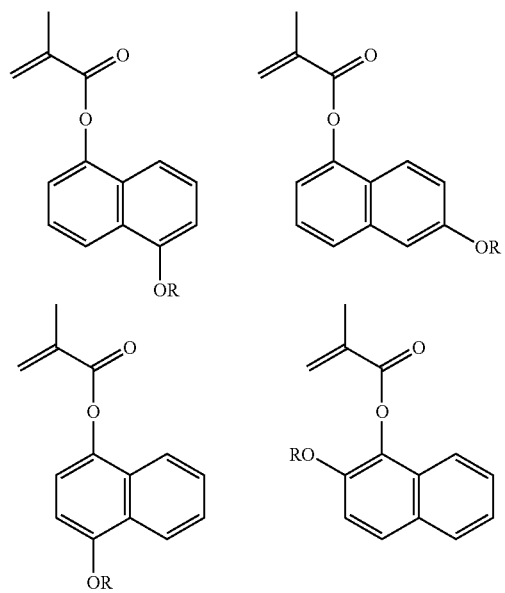

-continued
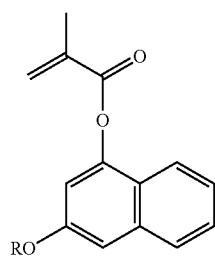 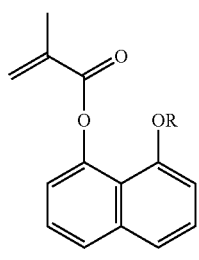 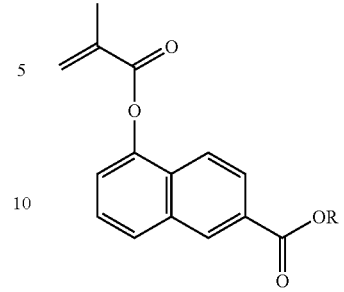 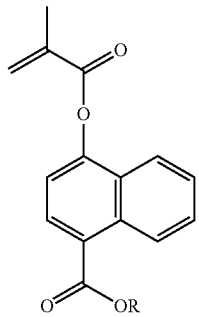
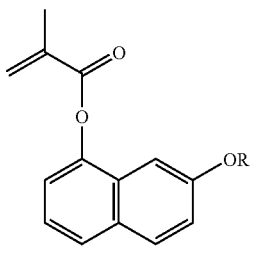 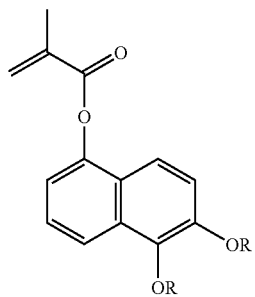 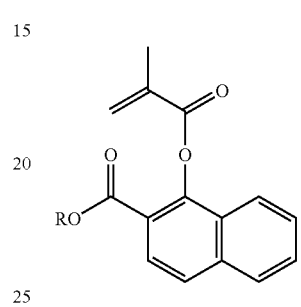 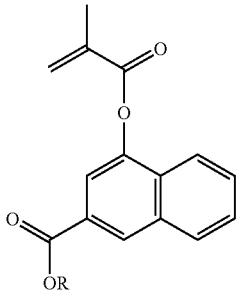
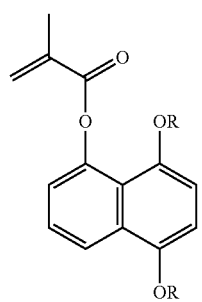 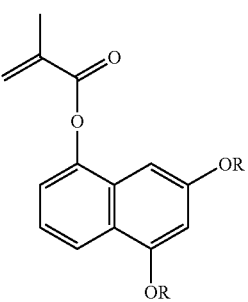 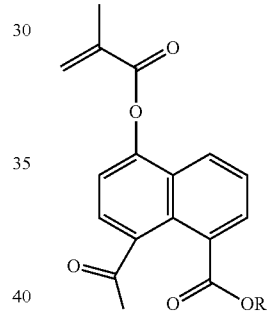 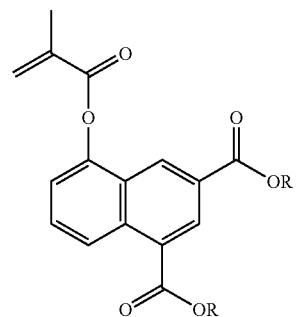
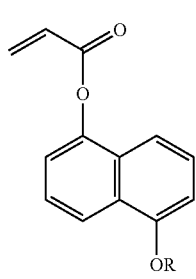 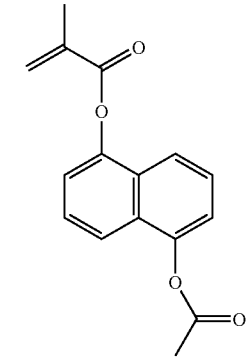 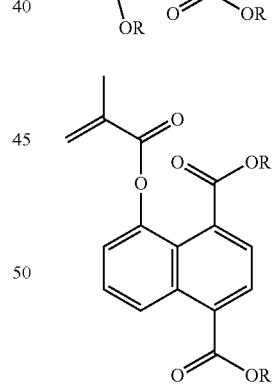 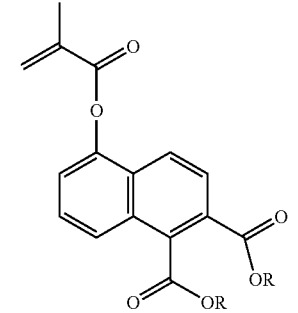
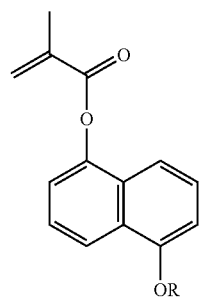 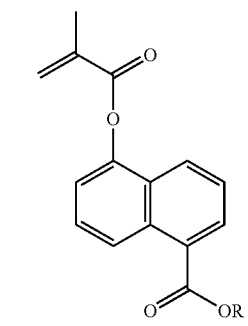 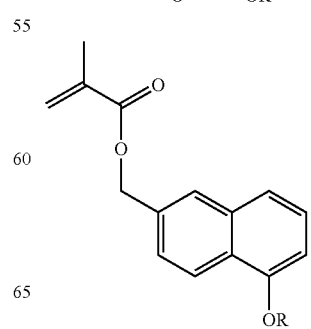 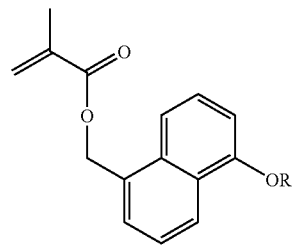

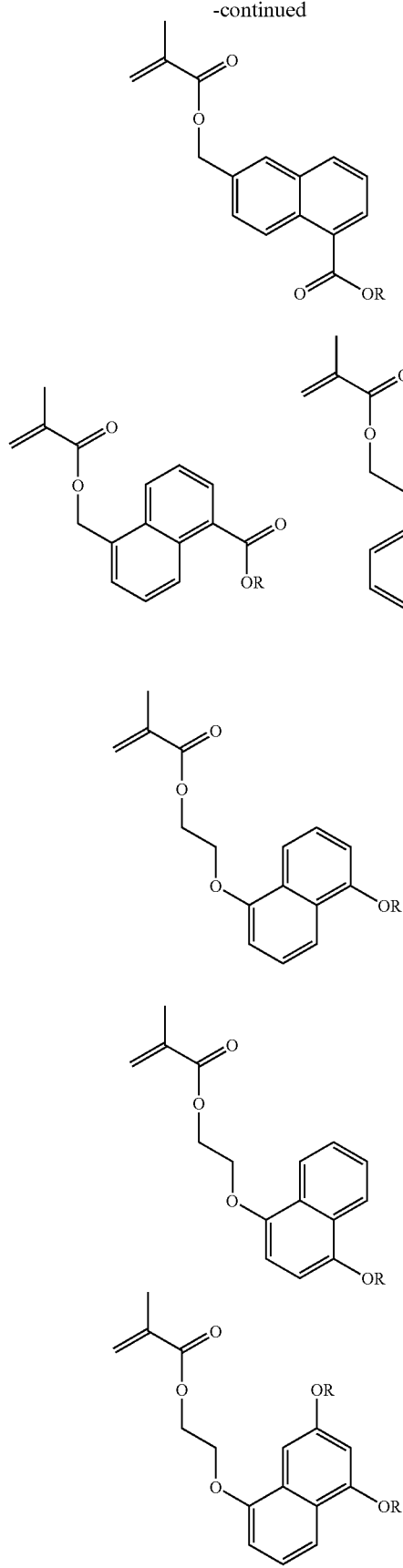

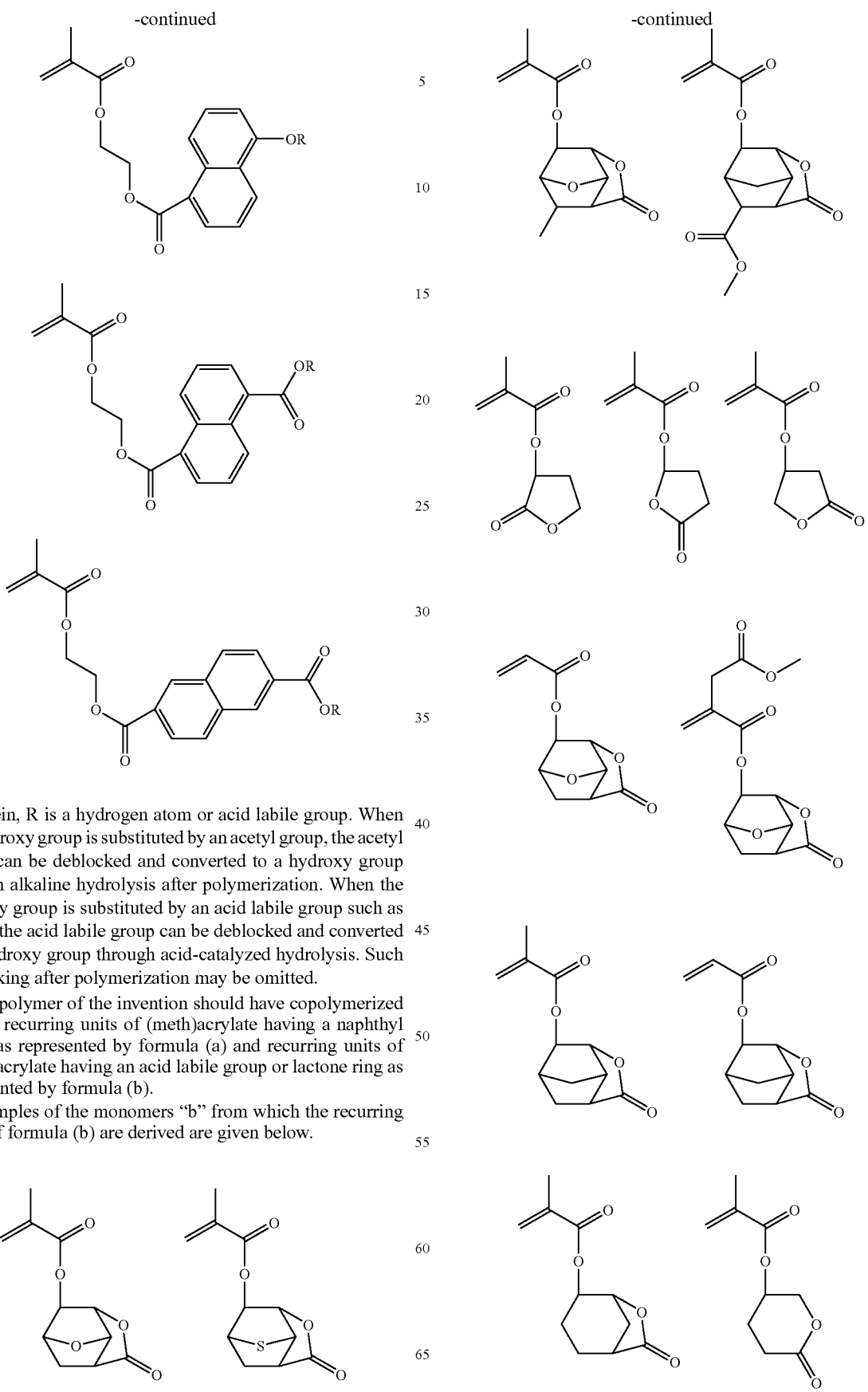

Herein, R is a hydrogen atom or acid labile group. When the hydroxy group is substituted by an acetyl group, the acetyl group can be deblocked and converted to a hydroxy group through alkaline hydrolysis after polymerization. When the hydroxy group is substituted by an acid labile group such as acetal, the acid labile group can be deblocked and converted to a hydroxy group through acid-catalyzed hydrolysis. Such deblocking after polymerization may be omitted.

The polymer of the invention should have copolymerized therein recurring units of (meth)acrylate having a naphthyl group as represented by formula (a) and recurring units of (meth)acrylate having an acid labile group or lactone ring as represented by formula (b).

Examples of the monomers "b" from which the recurring units of formula (b) are derived are given below.

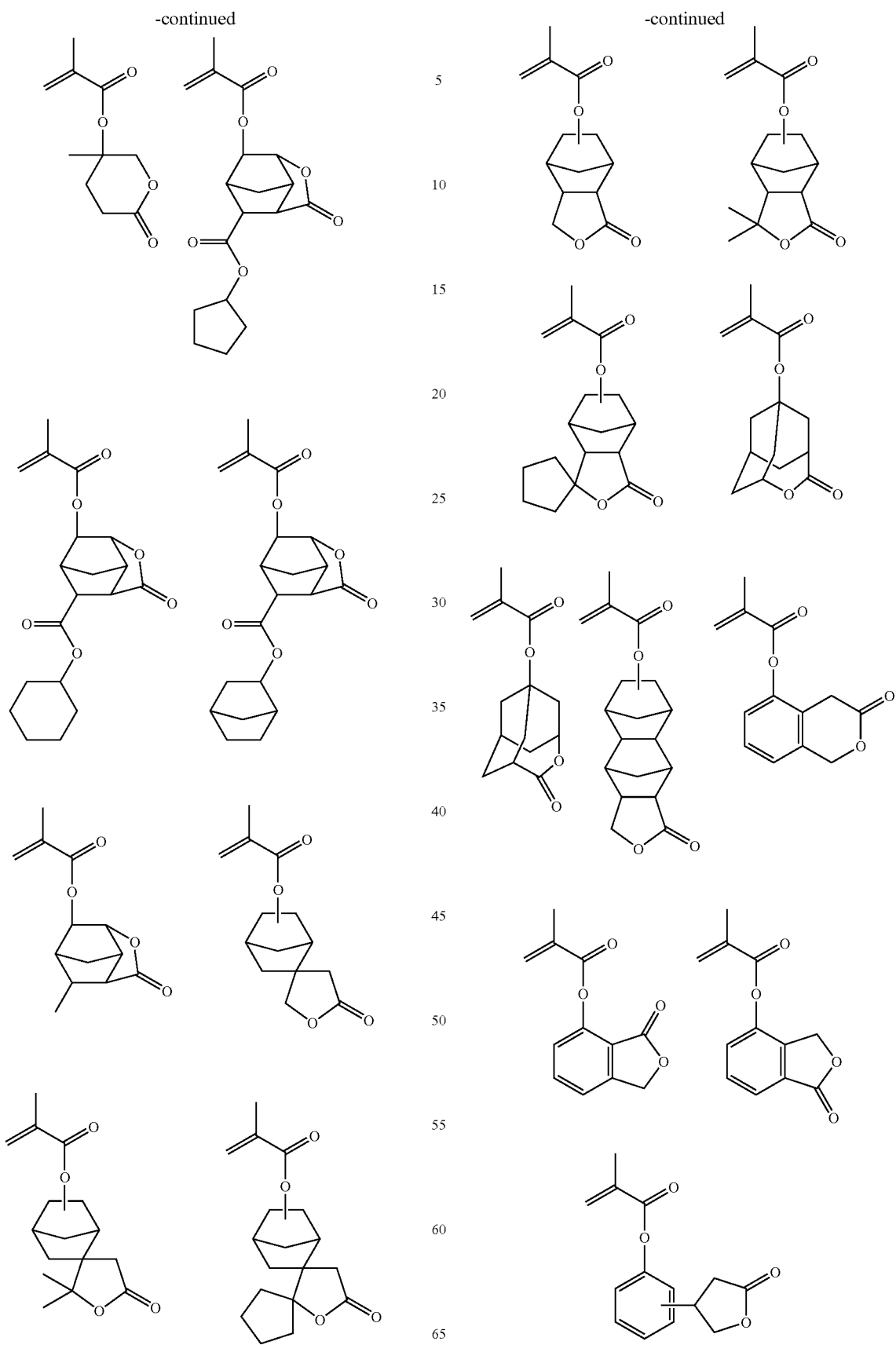

In order that the resist composition of the invention be positive working, advantageously the polymer has further copolymerized therein a monomer "c" having an acid labile group as represented by the following general formula.

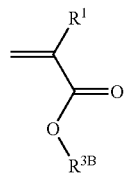

Herein $R^1$ is as defined above, and $R^{3B}$ is an acid labile group.

The acid labile groups represented by R and $R^{3B}$ may be identical or different and selected from a variety of such groups. Preferred are structures in which the hydrogen atom of hydroxyl group or of hydroxyl moiety of carboxyl group is substituted with a group of formula (AL-10) or (AL-11), a tertiary alkyl group of 4 to 40 carbon atoms represented by formula (AL-12), an oxoalkyl group of 4 to 20 carbon atoms, or the like.

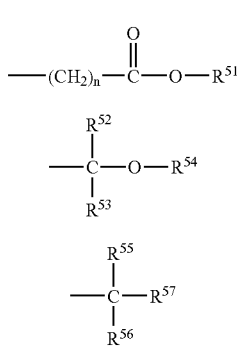

In formulae (AL-10) and (AL-11), $R^{51}$ and $R^{54}$ each are a monovalent hydrocarbon group, typically a straight, branched or cyclic alkyl group of 1 to 40 carbon-atoms, especially 1 to 20 carbon atoms, which may contain a heteroatom such as oxygen, sulfur, nitrogen or fluorine. The subscript n is an integer of 0 to 10. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$ taken together, may form a ring with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

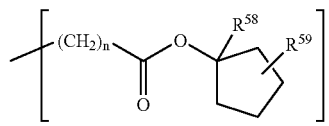

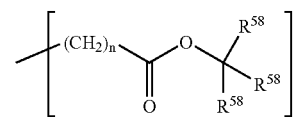

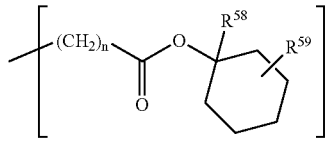

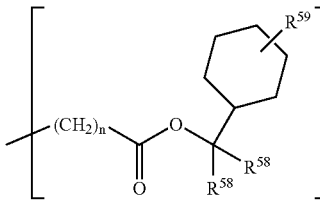

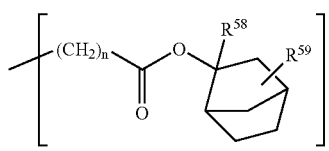

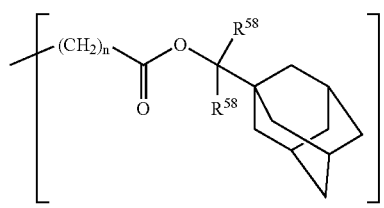

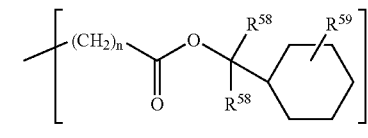

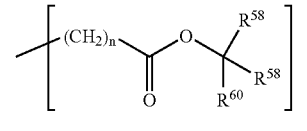

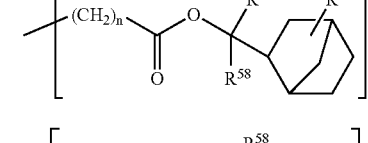

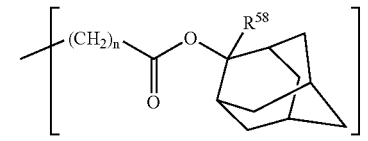

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and n is an integer of 0 to 10.
Illustrative examples of the acetal group of formula (AL-11) include those of the following formulae (AL-11)-1 to (AL-11)-34.
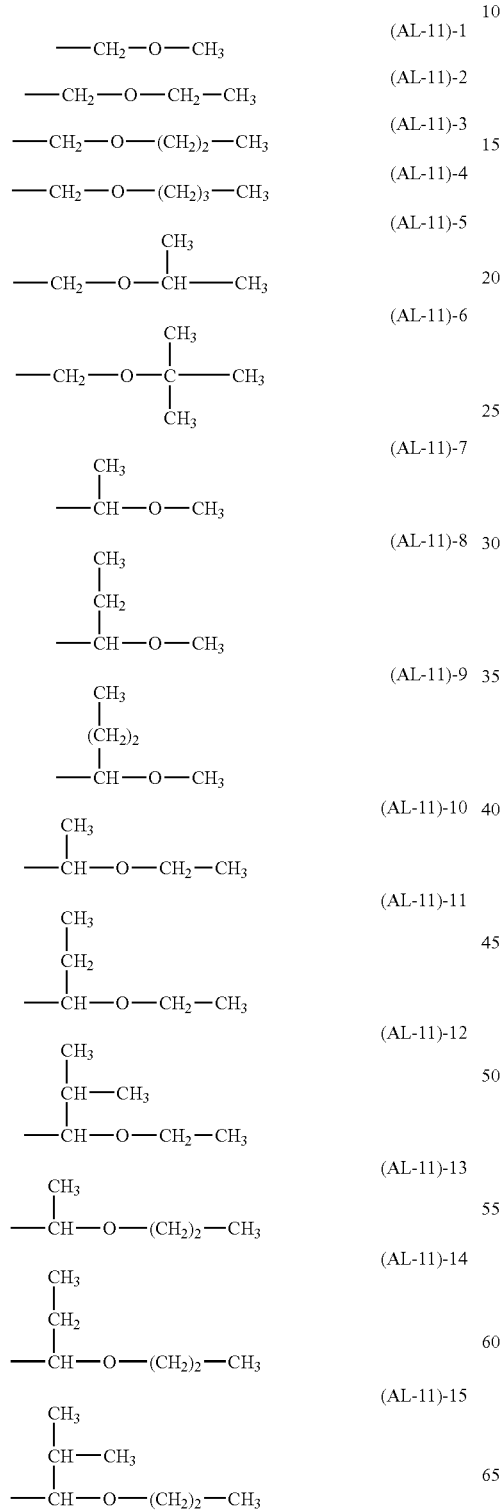
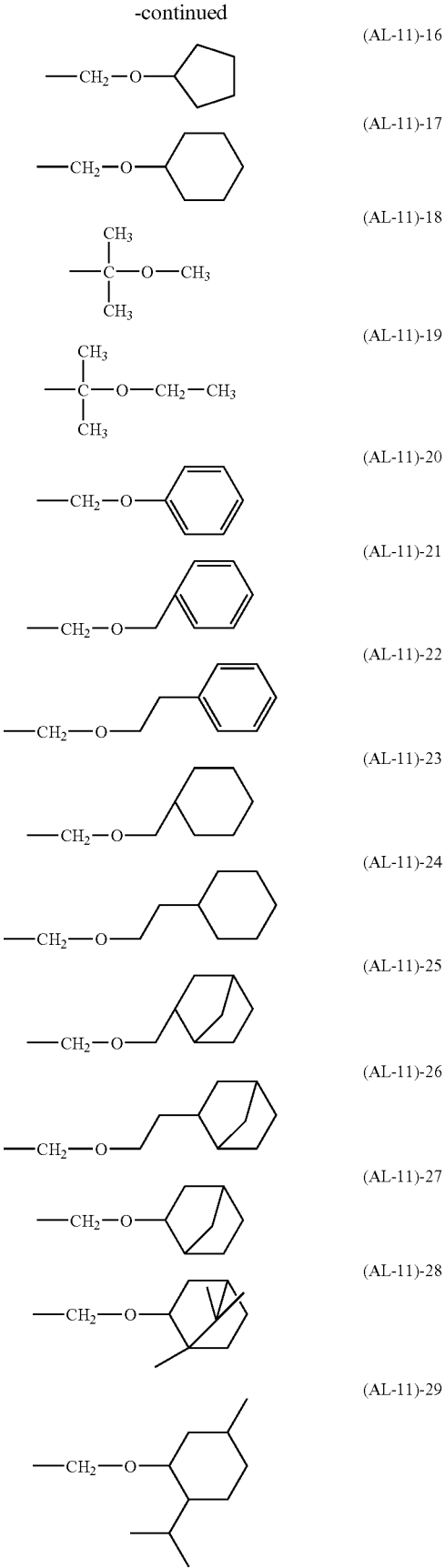

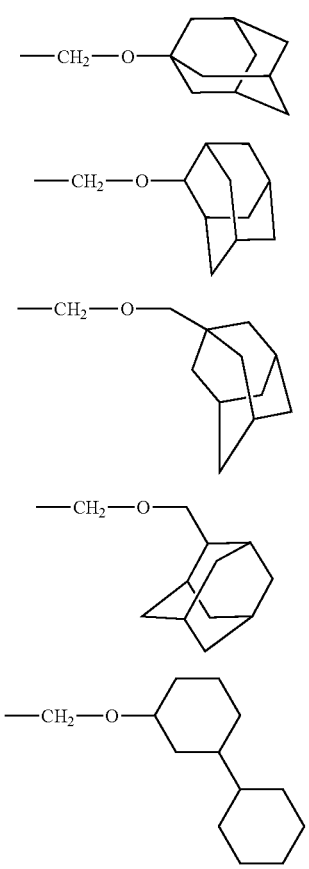

(AL-11)-30

(AL-11)-31

(AL-11)-32

(AL-11)-33

(AL-11)-34

The polymer may be crosslinked within the molecule or between molecules with acid labile groups of formula (AL-11a) or (AL-11b).

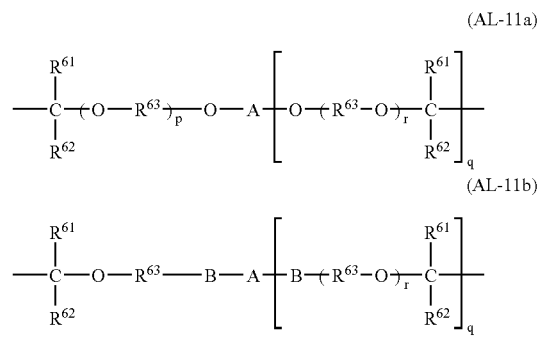

(AL-11a)

(AL-11b)

Herein $R^{61}$ and $R^{62}$ each are hydrogen or a straight, branched or cyclic $C_1$-$C_8$ alkyl group, or $R^{61}$ and $R^{62}{}_1$ taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of p and r is 0 or an integer of 1 to 10, preferably 0 or an integer of 1 to 5, and q is an integer of 1 to 7. "A" is a (q+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript q is preferably an integer of 1 to 3.

The crosslinking acetal groups of formulae (AL-11a) and (AL-11b) are exemplified by the following formulae (AL-11)-35 through (AL-11)-42.

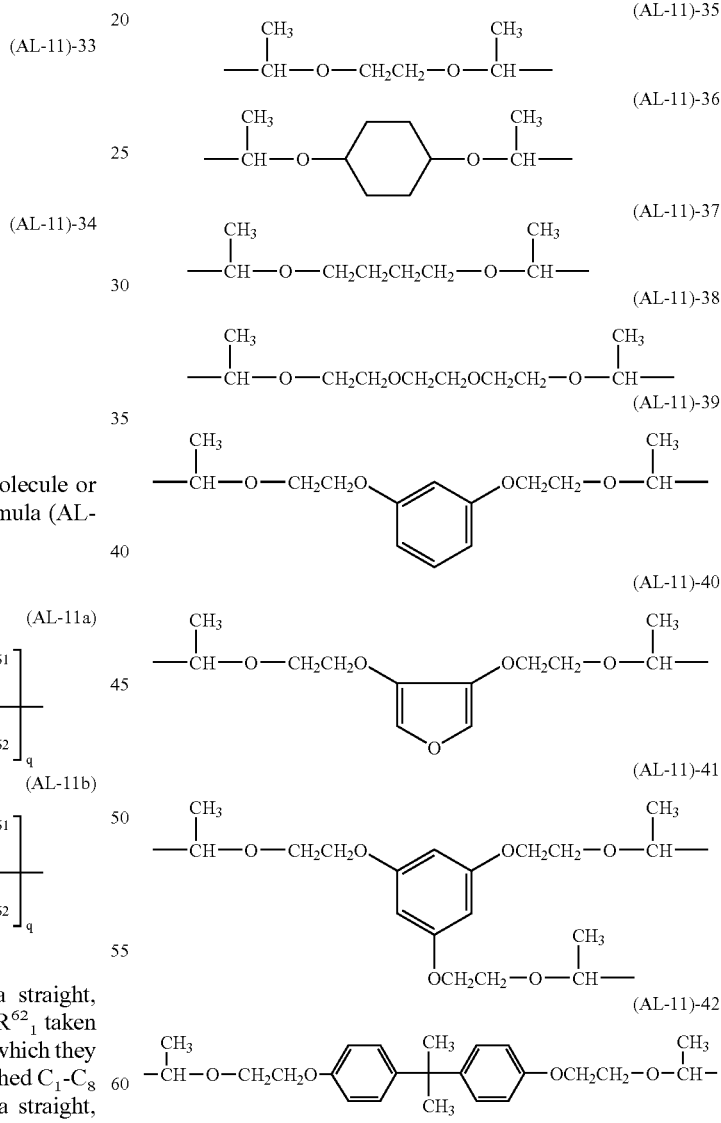

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

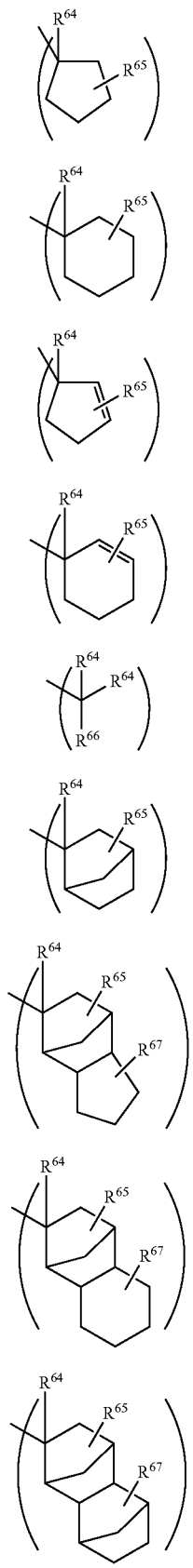
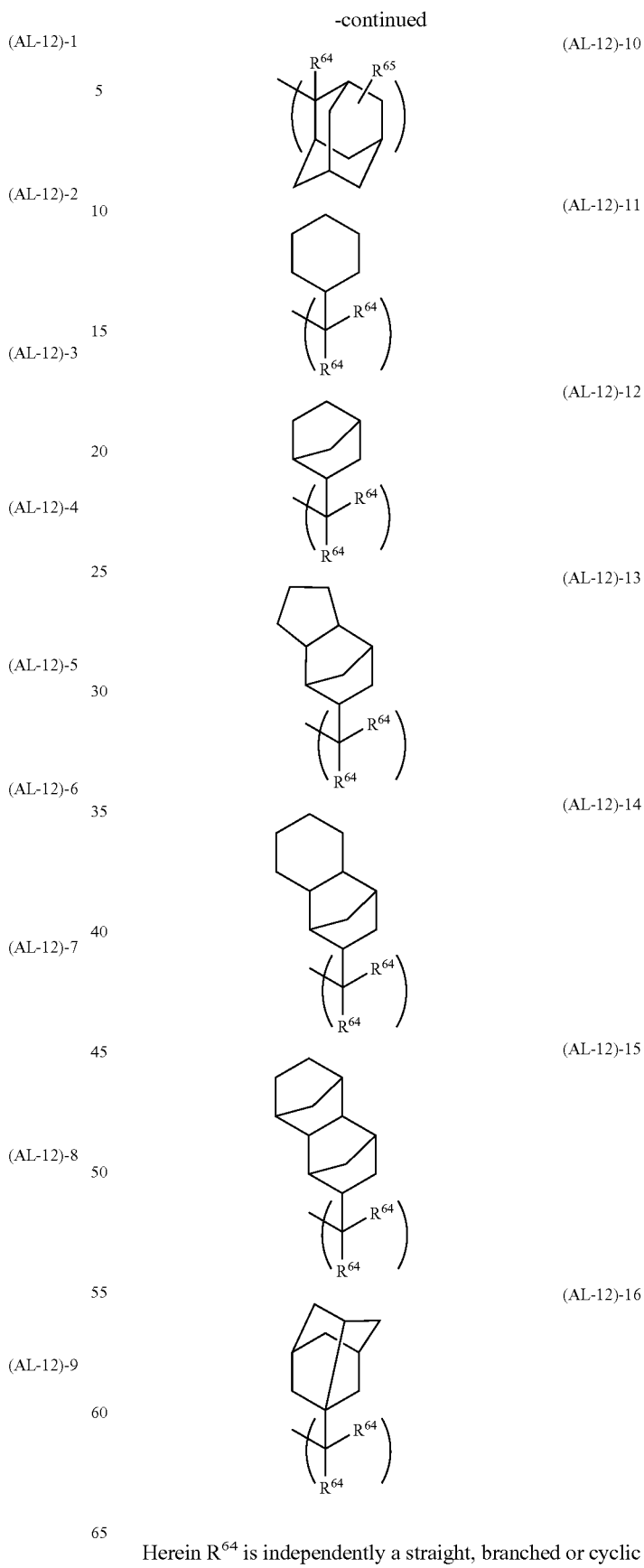
Herein $R^{64}$ is independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group which may contain a heteroatom such as oxygen, sulfur or nitrogen; and s is an integer of 1 to 3.

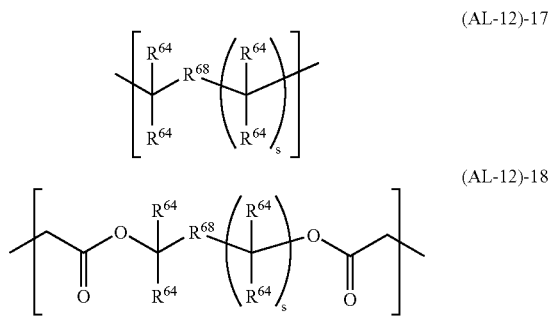

(AL-12)-17

(AL-12)-18

The groups represented by $R^{64}$, $R^{65}$, $R^{66}$ and $R^{67}$ may contain a heteroatom such as oxygen, nitrogen or sulfur, examples of which are illustrated by those of the following formulae (AL-13)-1 to (AL-13)-7.

—(CH$_2$)$_4$OH  (AL-13)-1

—(CH$_2$)$_2$O(CH$_2$)$_3$CH$_3$  (AL-13)-2

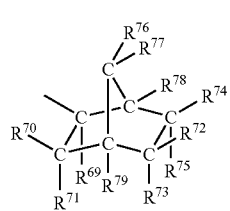

(AL-13)-3

—(CH$_2$)$_2$O(CH$_2$)$_2$OH  (AL-13)-4

—(CH$_2$)$_6$OH  (AL-13)-5

(AL-13)-6

(AL-13)-7

Of the acid labile groups of formula (AL-12), recurring units having an exo-form structure represented by the formula (AL-12)-19 are preferred.

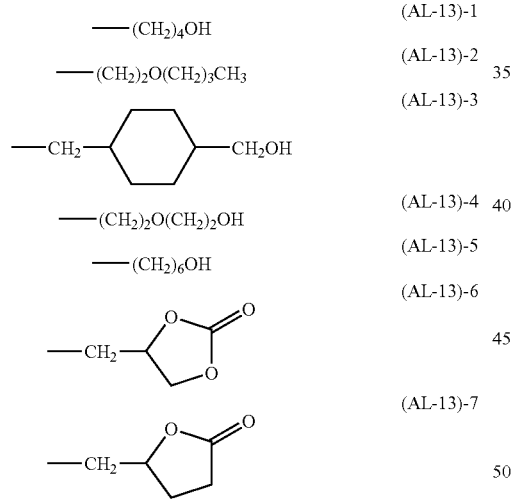

(AL-12)-19

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$, taken together, may form a ring, and in this case, each R is a divalent hydrocarbon group of 1 to 15 carbon atoms which may contain a heteroatom. Also, a pair of $R^{70}$ and $R^{79}$, $R^{76}$ and $R^{79}$, or $R^{72}$ and $R^{74}$ which are attached to adjoining carbon atoms may bond together directly to form a double bond. $R^{77}$ is hydrogen or a straight, branched or cyclic $C_1$-$C_{15}$ alkyl group. The formula also represents an enantiomer.

The ester form monomers from which recurring units having an exo-form structure represented by the formula (AL-12)-19:

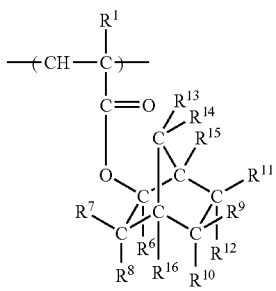

are derived are described in U.S. Pat. No. 6,448,420 (JP-A 2000-327633). Illustrative non-limiting examples of suitable monomers are given below.

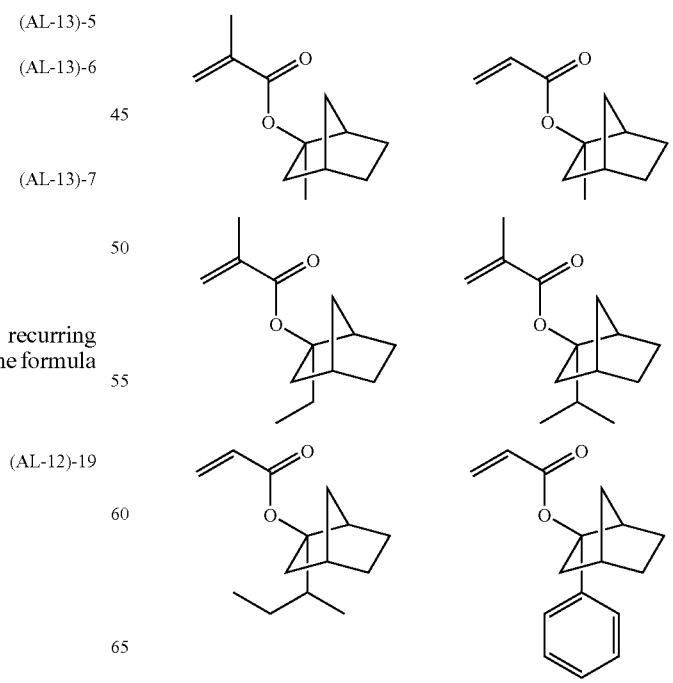

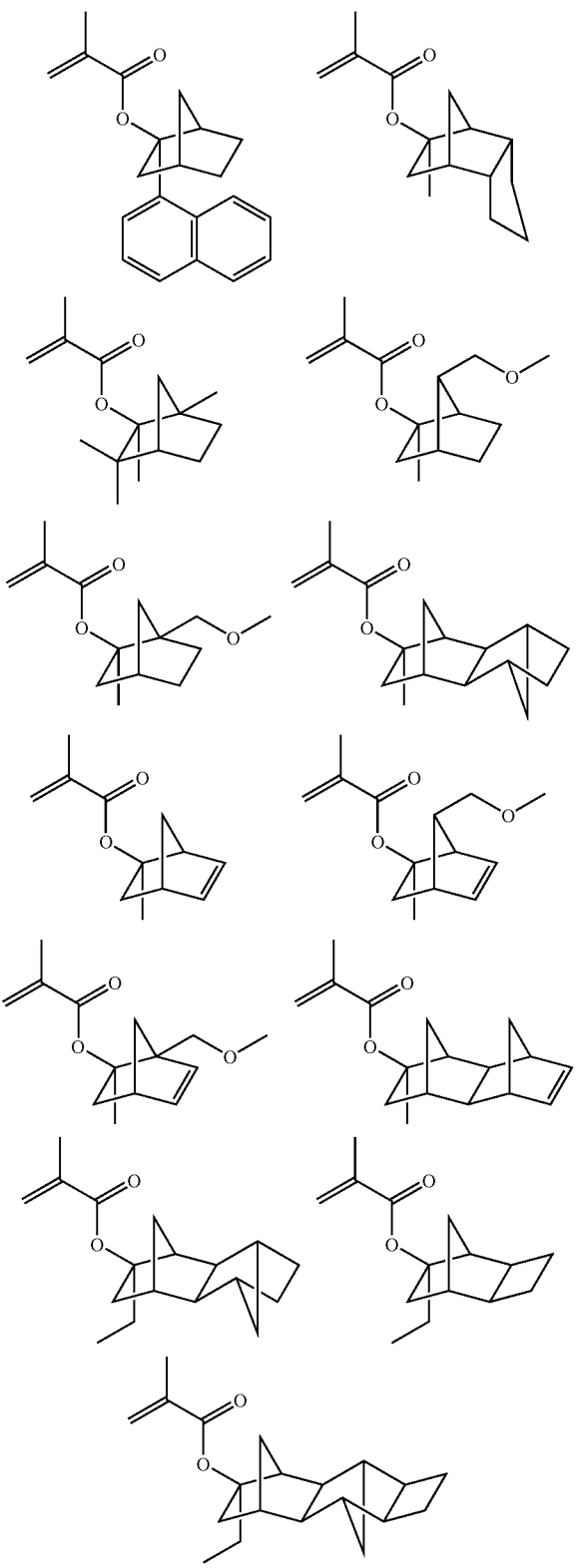

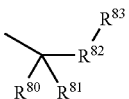
(AL-12)-20

Herein, $R^{80}$ and $R^{81}$ are each independently a straight, branched or cyclic, monovalent hydrocarbon group of 1 to 10 carbon atoms. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a straight, branched or cyclic, monovalent hydrocarbon group of 1 to 10 carbon atoms which may contain a heteroatom.

Examples of the monomers from which the recurring units substituted with acid labile groups having furandiyl, tetrahydrofurandiyl and oxanorbornanediyl as represented by the formula:

$$-(CH-\underset{\underset{\underset{R^{80}\ R^{81}}{|}}{\underset{|}{C=O}}}{\overset{R^{1}}{\overset{|}{C}}})-\!\!\!-$$

(wherein $R^{80}$, $R^{81}$, $R^{82}$ and $R^{83}$ are as defined above) are derived are shown below. Note that Me is methyl and Ac is acetyl.

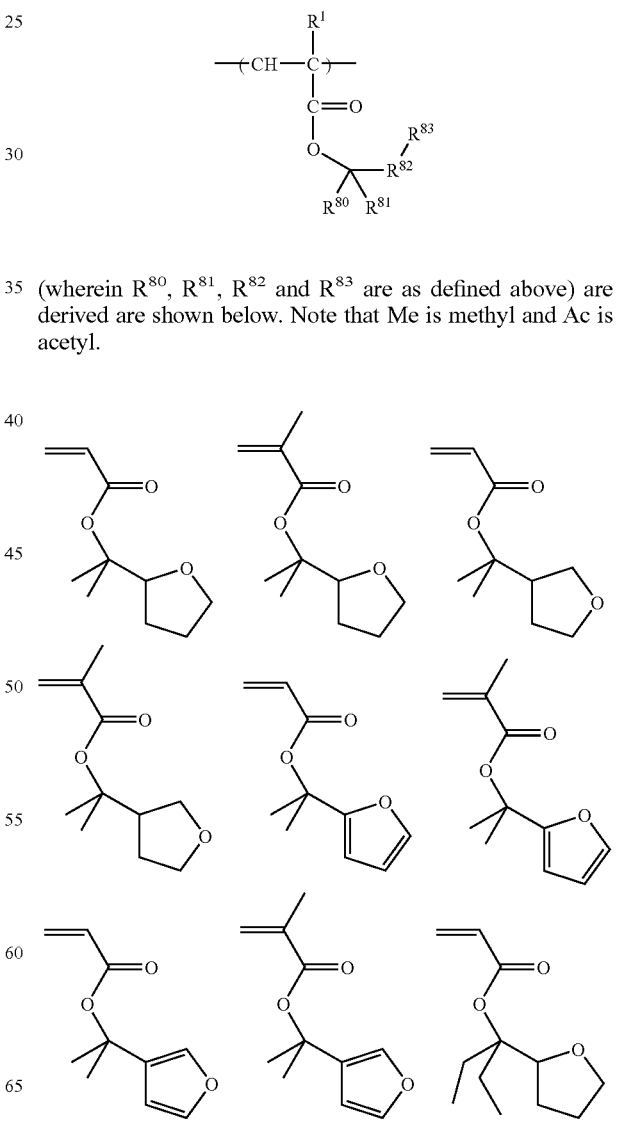

Also included in the acid labile groups of formula (AL-12) are acid labile groups having furandiyl, tetrahydrofurandiyl or oxanorbornanediyl as represented by the following formula (AL-12)-20.

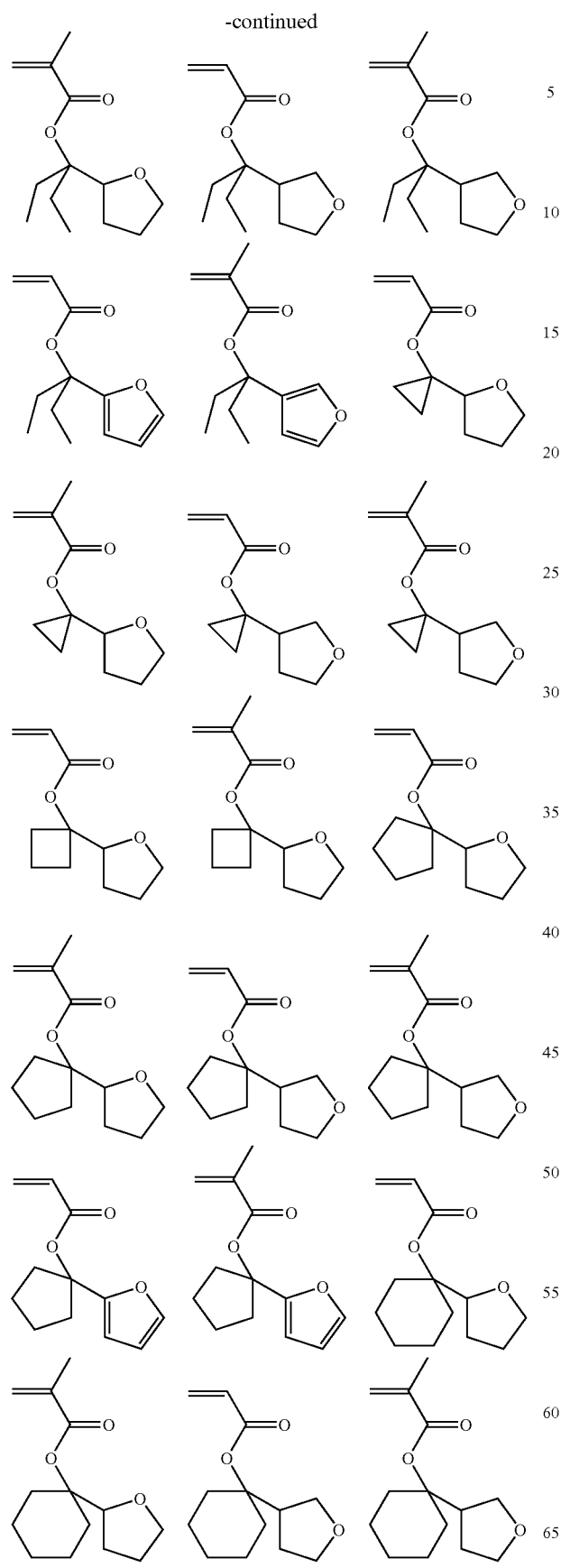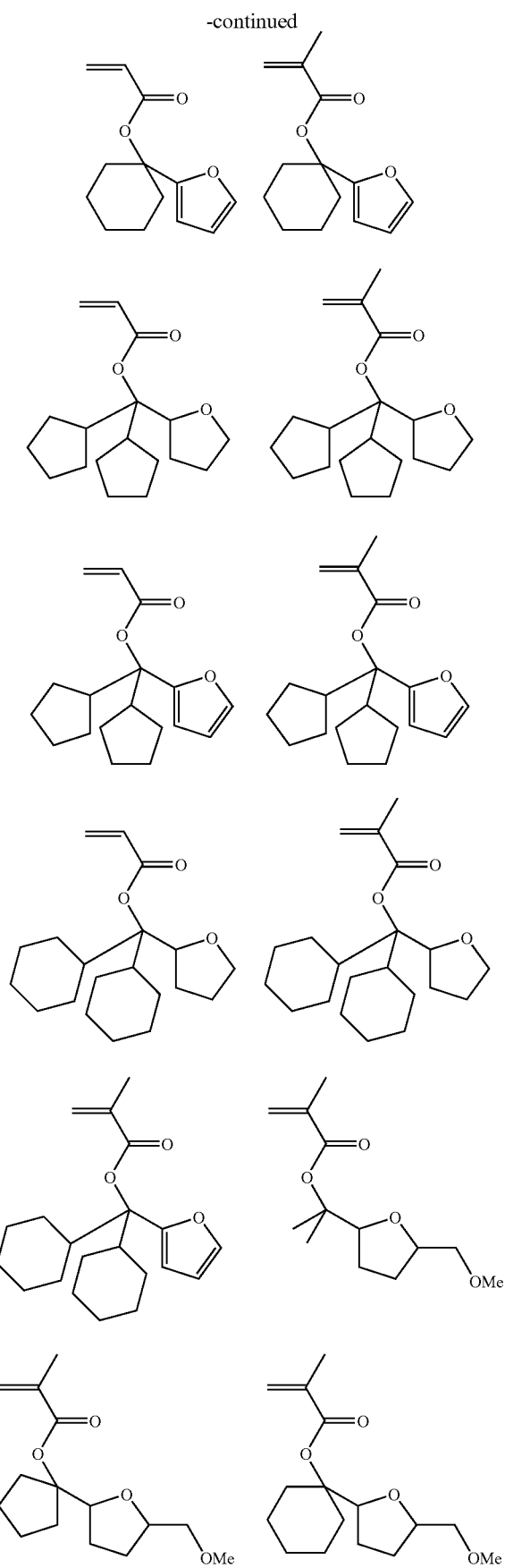

-continued
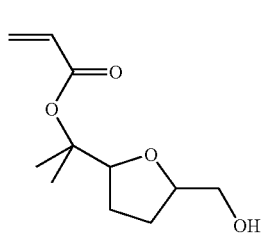 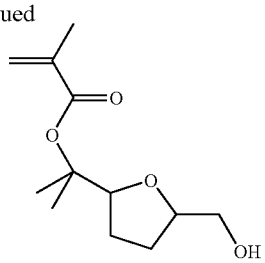 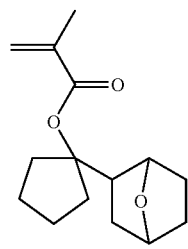
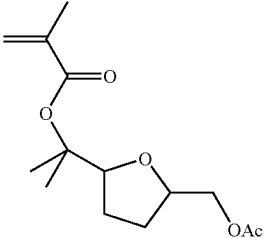 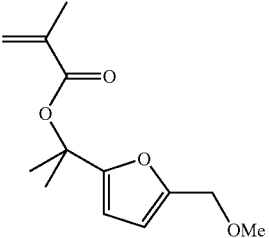
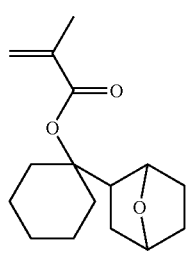 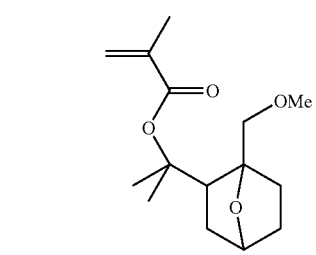
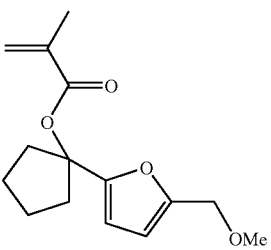 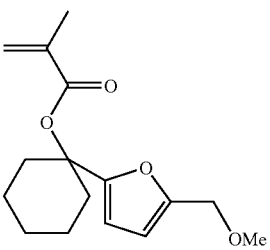
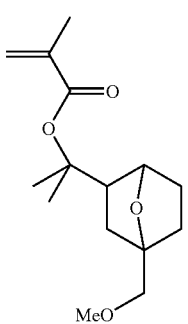 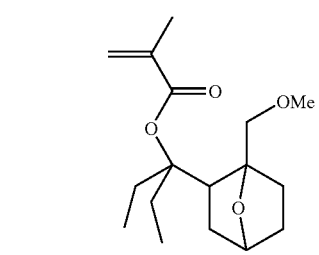
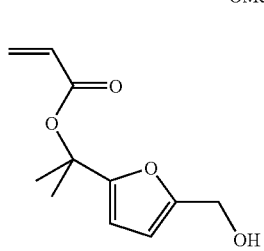 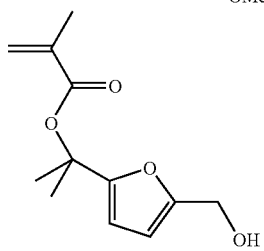
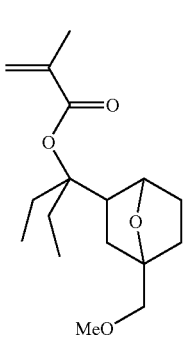 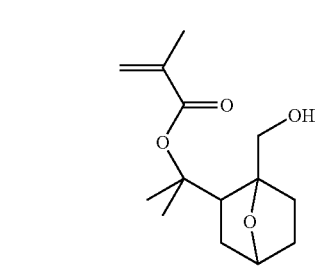
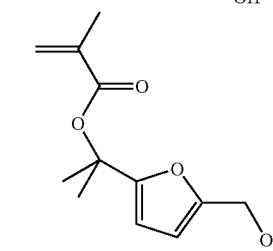 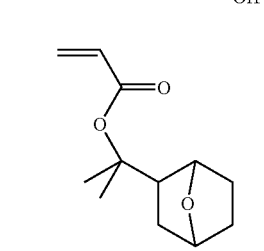
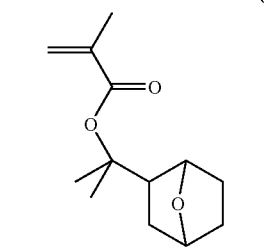 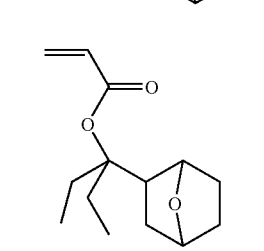
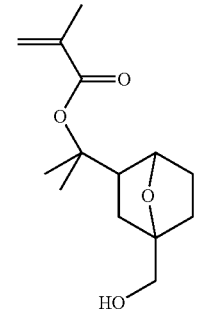 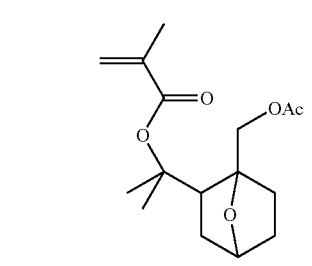
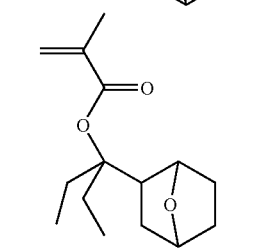 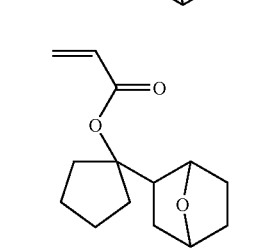

-continued
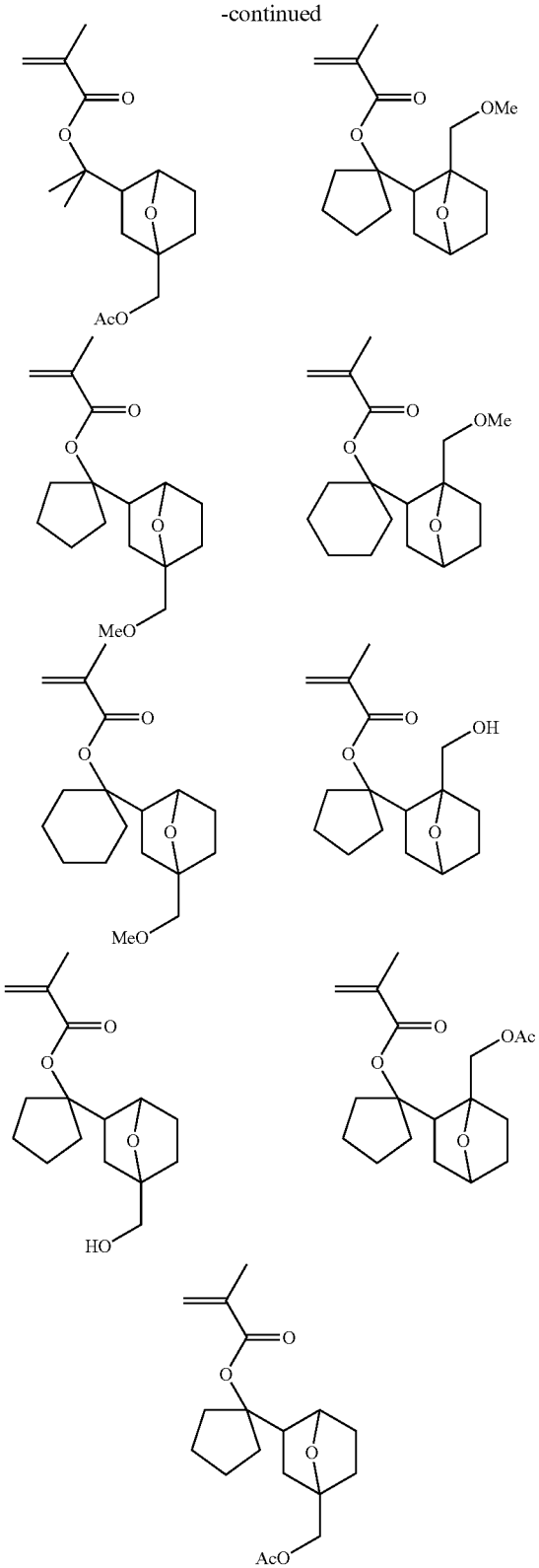
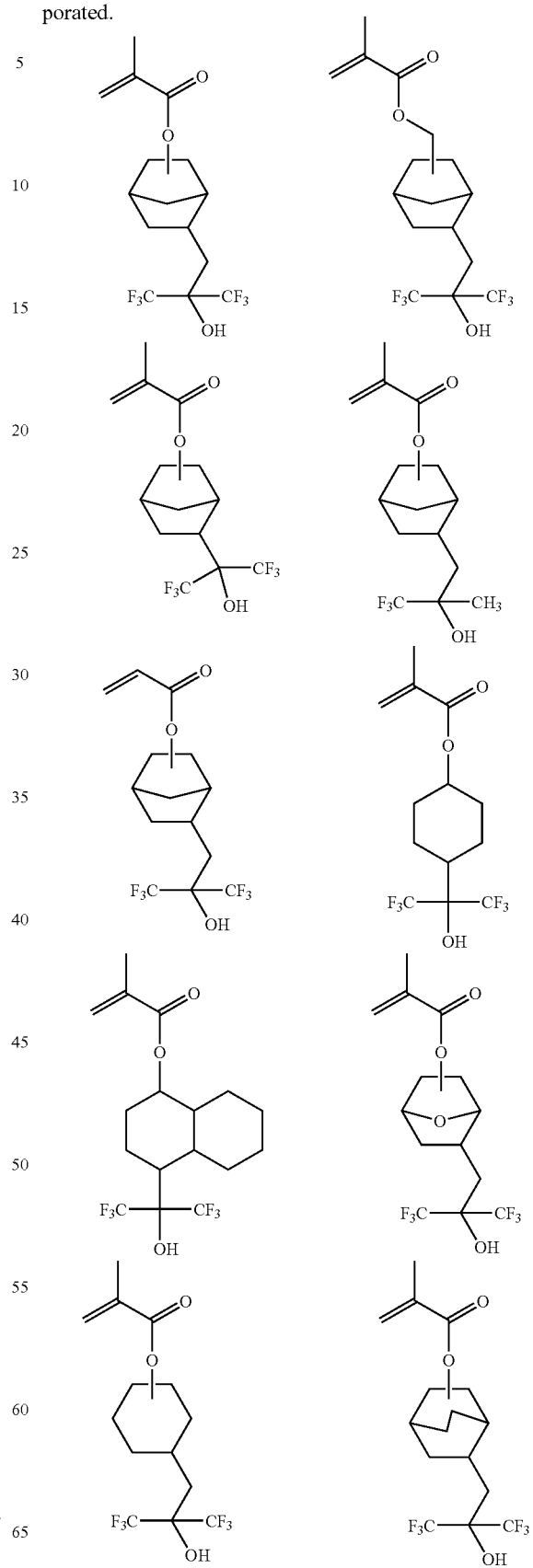
groups other than formulae (a) and (c). Specifically, recurring units "d" derived from monomers, listed below, may be incorporated.
While the polymer to be compounded in the resist composition of the invention includes essentially recurring units of formulae (a) and (b) or formulae (a), (b) and (c), it may have copolymerized therein recurring units having adhesive -continued
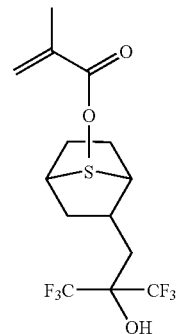
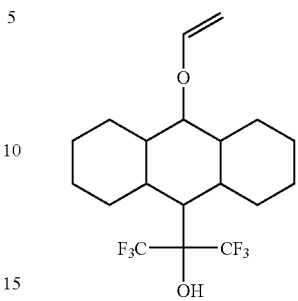
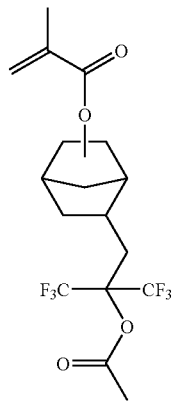
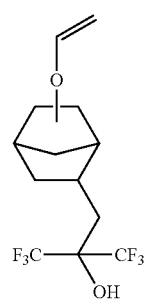
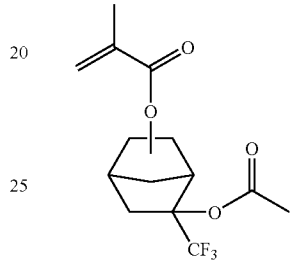
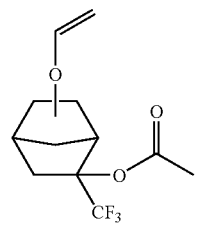
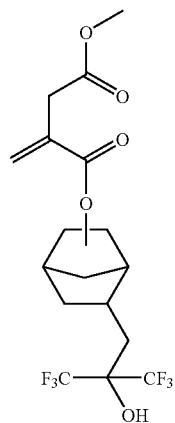
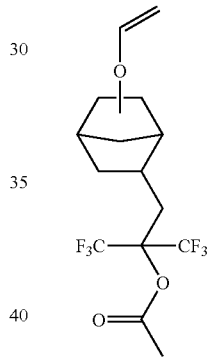
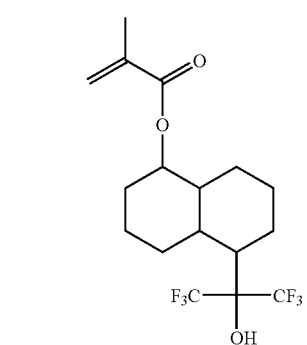
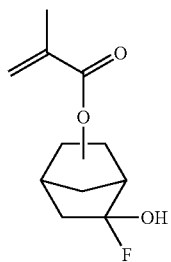
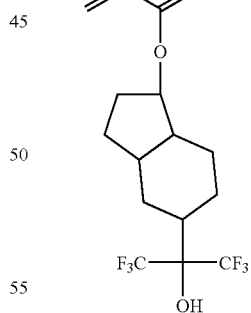
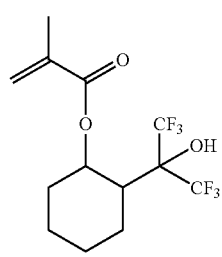
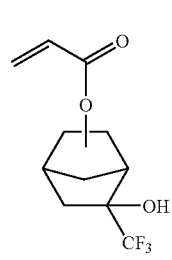
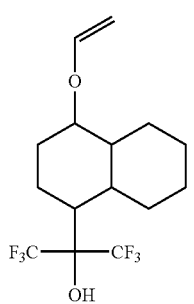
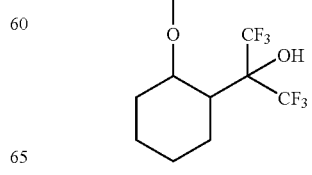
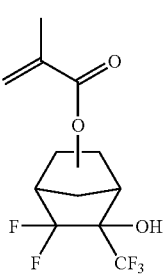
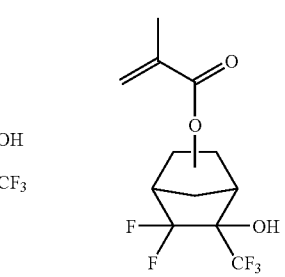

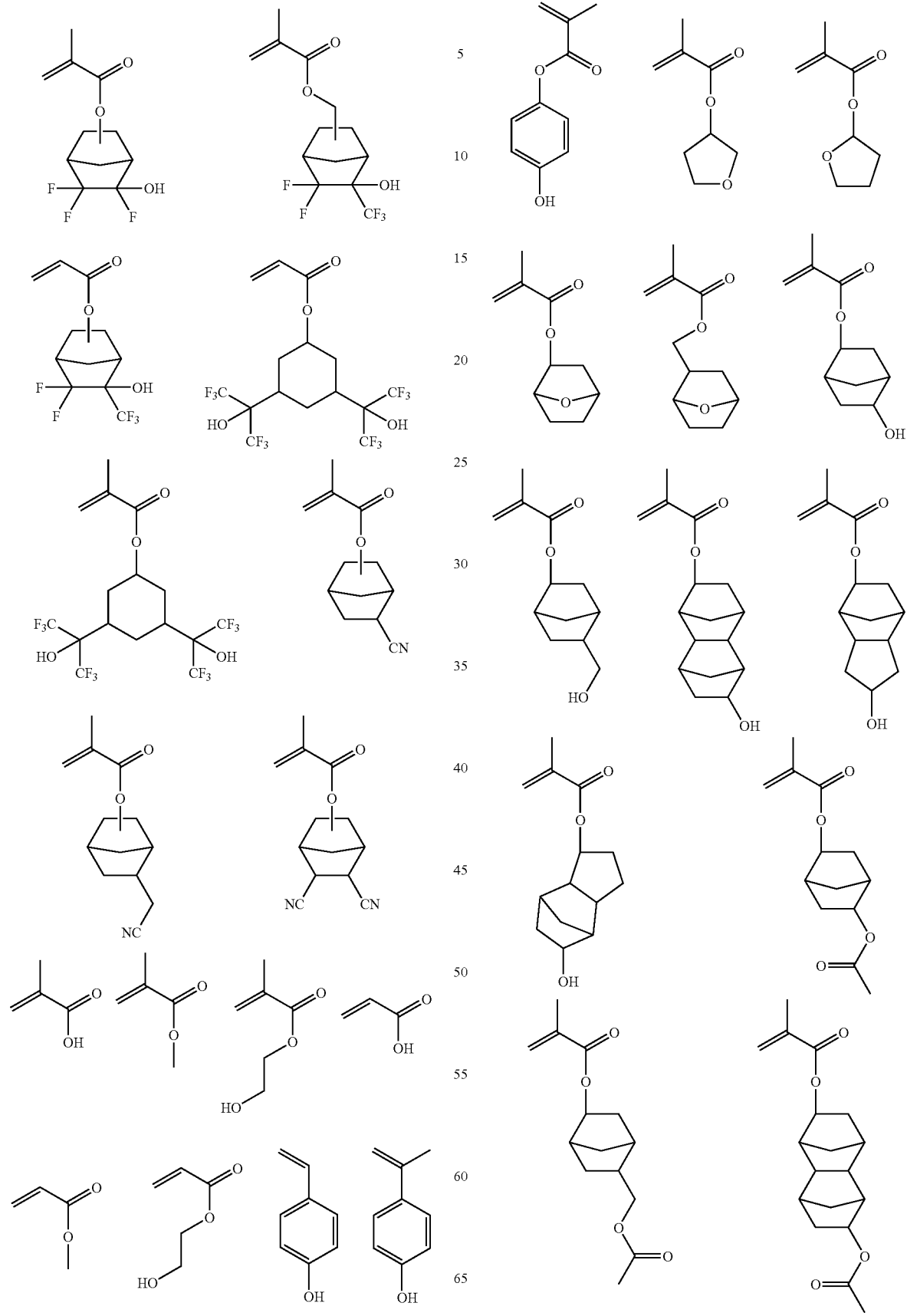

-continued
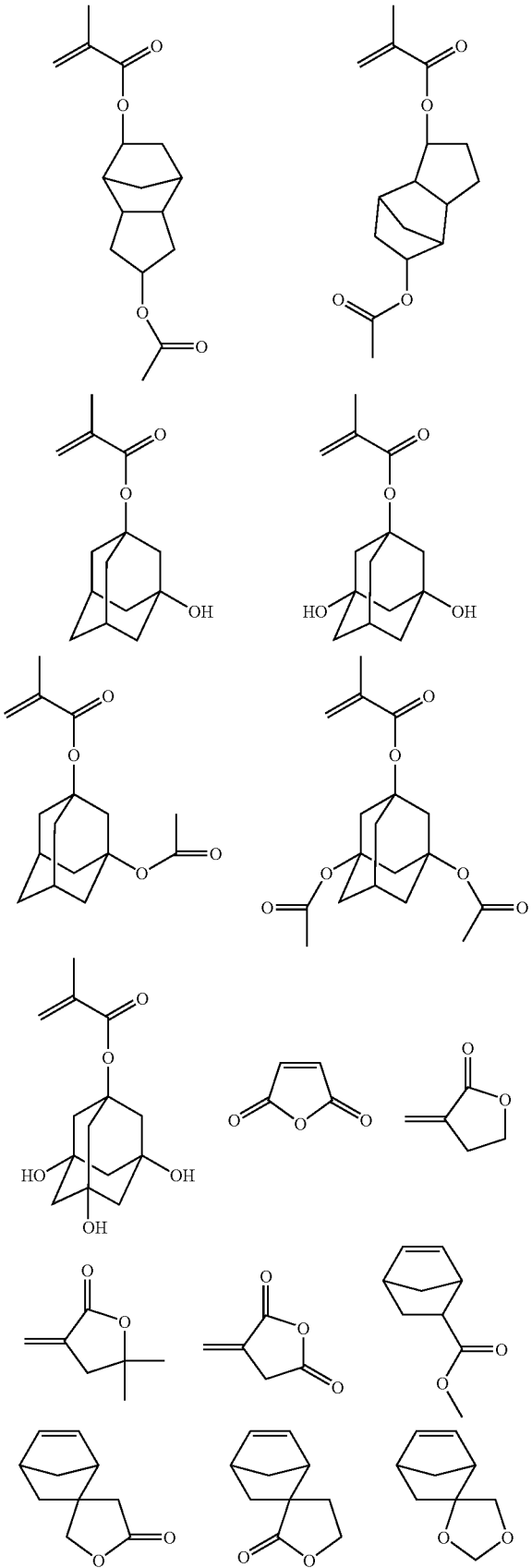
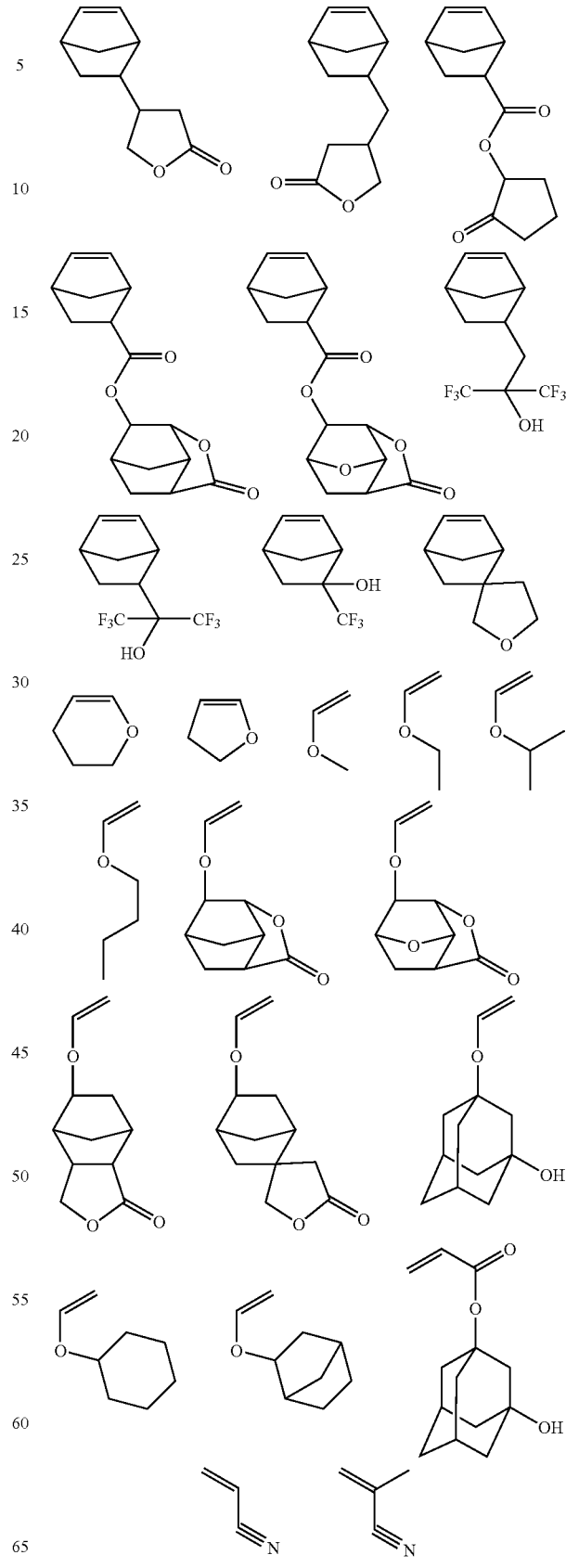

In the polymer of the invention, the recurring units "a", "b", "c" and "d" are present in proportions which satisfy the range: $0<a<1.0$, $0<b\leq0.8$, $0\leq c\leq0.8$, $0<b+c\leq0.8$, and $0\leq d\leq0.8$, preferably $0.01\leq a\leq0.9$, $0.05\leq b\leq0.7$, $0.05\leq c\leq0.7$, and $0\leq d\leq0.7$. Understandably, it is preferred that the sum of a+b+c+d be equal to 1. For a polymer comprising recurring units a, b, c and d, a+b+c+d=1 means that the total of recurring units a, b, c and d is 100 mol % relative to the total of entire recurring units.

The polymer of the invention should preferably have a weight average molecular weight (Mw) in the range of 1,000 to 500,000, more preferably 2,000 to 30,000 as measured by gel permeation chromatography (GPC) using polystyrene standards. With too low a Mw, the resist composition may be less heat resistant. With too high a Mw, the resist composition may lose alkali solubility and give rise to a footing phenomenon after pattern formation.

If a polymer has a wide molecular weight distribution or dispersity (Mw/Mn), which indicates the presence of lower and higher molecular weight polymer components, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that on use of the polymer as the base resin, a blend of two or more polymers which differ in compositional ratio, molecular weight or dispersity is acceptable.

The polymer of the invention may be synthesized by any desired method, for example, by dissolving unsaturated bond-containing monomers corresponding to the respective units "a", "b", "c" and "d" in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. The acid labile group that has been incorporated in the monomers may be kept as such, or the acid labile group may be once removed with an acid catalyst and thereafter protected or partially protected.

In addition to the polymer, the positive resist composition, especially chemically amplified positive resist composition of the invention may comprise an organic solvent, a compound capable of generating an acid in response to high-energy radiation (photoacid generator), and optionally, a dissolution inhibitor, a basic compound, a surfactant and other additives.

Solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, diethylene glycol dimethyl ether, 1-ethoxy-2-propanol and propylene glycol monomethyl ether acetate, and mixtures thereof are preferred because the photoacid generator is most soluble therein.

The organic solvent is preferably used in an amount of about 200 to 1,000 parts by weight, more preferably about 400 to 800 parts by weight per 100 parts by weight of the base resin.

Photoacid Generator

The photoacid generator is a compound capable of generating an acid upon exposure to high-energy radiation and includes the following:
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.

(i) Onium salts of formula (P1a-1), (P1a-2) or (P1b):

(P1a-1)

(P1a-2)

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are an alkylene group of 1 to 6 carbon atoms when they form a ring. $K^{31}$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

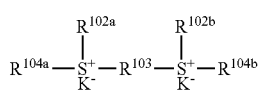

(P1b)

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2)

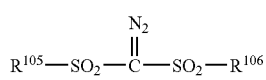

(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

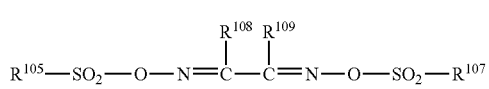

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are a straight or branched alkylene group of 1 to 6 carbon atoms when they form a ring. $R^{105}$ is as defined in formula (P2).

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

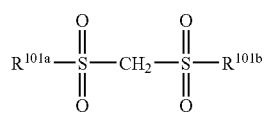

(P4)

Herein, $R^{101a}$ and $R^{101b}$ are as defined above.

(v) Sulfonic Acid Esters of N-Hydroxyimide Compounds of Formula (P5)

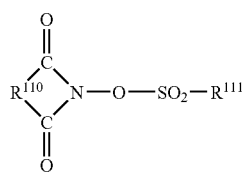

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), heteroaromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3- diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; and the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the photoacid generator include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone deratives and dicyclohexyl disulfone derivatives;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate, N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methane-sulfonate,
N-hydroxy-5-norbornene-2,3-dicarboxyimide trifluo-romethane-sulfonate, and
N-hydroxy-5-norbornene-2,3-dicarboxyimide p-toluene-sulfonate.

Preferred among these photoacid generators are onium salts such as triphenylsulfonium trifluoromethanesulfonate,
(p-tert-butoxyphenyl)diphenylsulfonium trifluoromethane-sulfonate,
tris(p-tert-butoxyphenyl)sulfonium trifluoromethane-sulfonate,
triphenylsulfonium p-toluenesulfonate,
(p-tert-butoxyphenyl)diphenylsulfonium p-toluene-sulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluo-romethane-sulfonate,
(2-norbornyl)methyl(2-oxocylohexyl)sulfonium trifluoro-methanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of 0.1 to 50 parts, and especially 0.5 to 40 parts by weight, per 100 parts by weight of the base resin. Less than 0.1 part of the photoacid generator may generate a less amount of acid upon exposure, sometimes leading to a poor sensitivity and resolution whereas more than 50 parts of the photoacid generator may adversely affect the transmittance and resolution of resist.

Dissolution Regulator

To the resist composition, a dissolution regulator or inhibitor may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

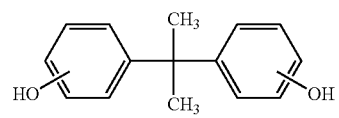

(D1)

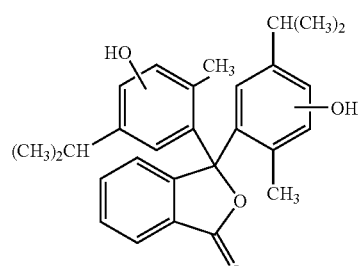

(D2)

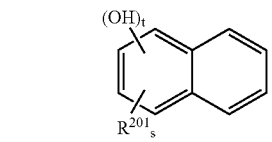

(D3)

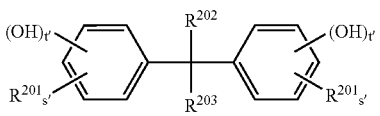

(D4)

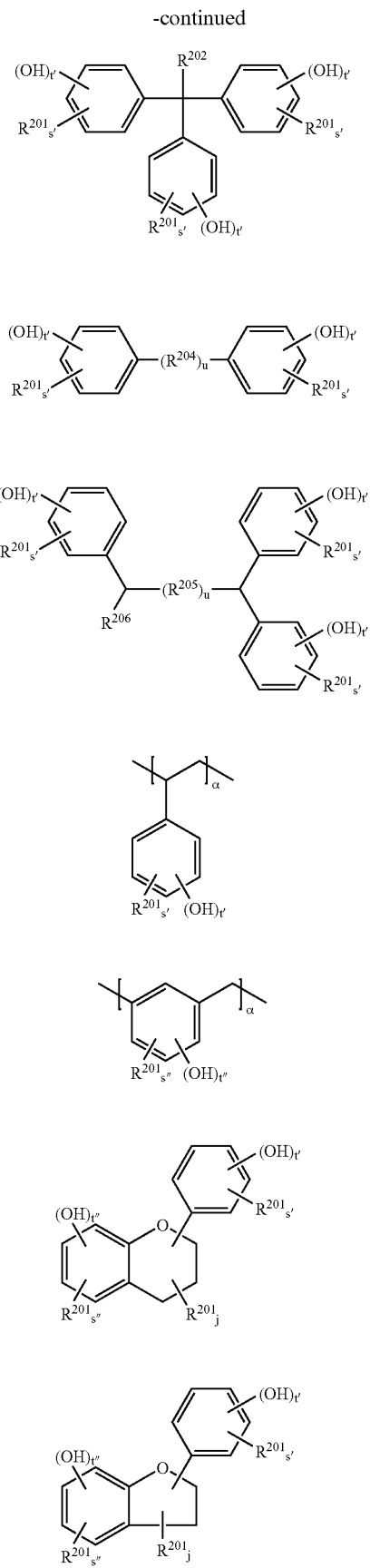

In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$— COOH; $R^{204}$ is —$(CH_2)_i$- (where i=2 to 10), a $C_6$-$C_{10}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a molecular weight of from 100 to 1,000.

The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. An appropriate amount of the dissolution inhibitor is effective for improving resolution whereas more than 50 parts would lead to slimming of the patterned film, and thus a decline in resolution.

Basic Compound

The basic compound used herein is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

$$N(X)_n(Y)_{3-n} \quad (B)-1$$

In the formula, n is equal to 1, 2 or 3; side chain Y is independently hydrogen or a straight, branched or cyclic alkyl group of 1 to 20,carbon atoms which may contain an ether or hydroxyl group; and side chain X is independently selected from groups of the following general formulas (X)-1 to (X)-3, and two or three X's may bond together to form a ring.

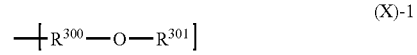

(X)-1

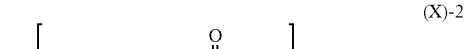

(X)-2

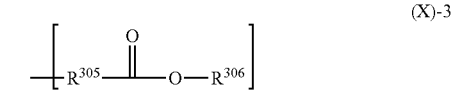

(X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4,1-aza-15-crown-5,1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N-N-bis(2-hydroxyethyl)-2-(methoxycarbonyl)ethylamine,
N-N-bis(2-acetoxyethyl)-2-(methoxycarbonyl)ethylamine,
N-N-bis(2-hydroxyethyl)-2-(ethoxycarbonyl)ethylamine,
N-N-bis(2-acetoxyethyl)-2-(ethoxycarbonyl)ethylamine,
N-N-bis(2-hydroxyethyl)-2-(2-methoxyethoxycarbonyl)ethylamine,
N-N-bis(2-acetoxyethyl)-2-(2-methoxyethoxycarbonyl)ethylamine,
N-N-bis(2-hydroxyethyl)-2-(2-hydroxyethoxycarbonyl)ethylamine,
N-N-bis(2-acetoxyethyl)-2-(2-acetoxyethoxycarbonyl)ethylamine,
N-N-bis(2-hydroxyethyl)-2-[(methoxycarbonyl)methoxycarbonyl]-ethylamine,
N-N-bis(2-acetoxyethyl)-2-[(methoxycarbonyl)methoxycarbonyl]-ethylamine,
N-N-bis(2-hydroxyethyl)-2-(2-oxopropoxycarbonyl)ethylamine,
N-N-bis(2-acetoxyethyl)-2-(2-oxopropoxycarbonyl)ethylamine,
N-N-bis(2-hydroxyethyl)-2-(tetrahydrofurfuryloxycarbonyl)-ethylamine,
N-N-bis(2-acetoxyethyl)-2-(tetrahydrofurfuryloxycarbonyl)-ethylamine,
N-N-bis(2-hydroxyethyl)-2-[(2-oxotetrahydrofuran-3-yl)oxy-carbonyl]ethylamine,
N-N-bis(2-acetoxyethyl)-2-[(2-oxotetrahydrofuran-3-yl)oxy-carbonyl]ethylamine,
N-N-bis(2-hydroxyethyl)-2-(4-hydroxybutoxycarbonyl)ethylamine,
N-N-bis(2-formyloxyethyl)-2-(4-formyloxybutoxycarbonyl)-ethylamine,
N-N-bis(2-formyloxyethyl)-2-(2-formyloxyethoxycarbonyl)-ethylamine,
N-N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are basic compounds having cyclic structure, represented by the following general formula (B)-2.

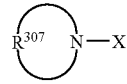

(B)-2

Herein X is as defined above, and $R^{307}$ is a straight or branched alkylene group of 2 to 20 carbon atoms which may contain one or more carbonyl, ether, ester or sulfide groups.

Illustrative examples of the compounds having formula (B)-2 include 1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, basic compounds having cyano group, represented by the following general formulae (B)-3 to (B)-6 are useful.

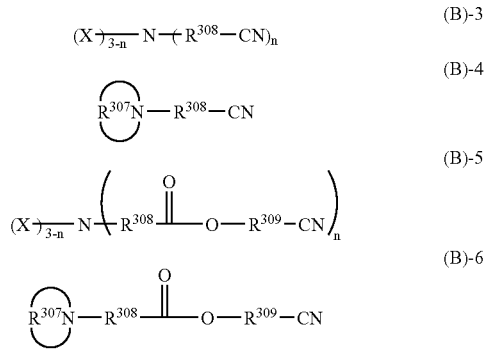

Herein, X, $R^{307}$ and n are as defined above, and $R^{308}$ and $R^{309}$ are each independently a straight or branched alkylene group of 1 to 4 carbon atoms.

Illustrative examples of the basic compounds having cyano group, represented by formulae (B)-3 to (B)-6, include 3-(diethylamino)propiononitrile,
N-N-bis(2-hydroxyethyl)-3-aminopropiononitrile,
N-N-bis(2-acetoxyethyl)-3-aminopropiononitrile,
N-N-bis(2-formyloxyethyl)-3-aminopropiononitrile,
N-N-bis(2-methoxyethyl)-3-aminopropiononitrile,
N-N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiono-nitrile,
N-(3-acetoxy-1-propyl)-N-(2-cyanoethyl)-3-aminopropiono-nitrile,
N-(2-cyanoethyl)-N-(3-formyloxy-1-propyl)-3-aminopropiono-nitrile,
N-(2-cyanoethyl)-N-tetrahydrofurfuryl-3-aminopropiononitrile,
N-N-bis(2-cyanoethyl)-3-aminopropiononitrile,
diethylaminoacetonitrile,
N-N-bis(2-hydroxyethyl)aminoacetonitrile,
N-N-bis(2-acetoxyethyl)aminoacetonitrile,
N-N-bis(2-formyloxyethyl)aminoacetonitrile,
N-N-bis(2-methoxyethyl)aminoacetonitrile,
N-N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N-N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

The basic compound is preferably formulated in an amount of 0.001 to 2 parts, and especially 0.01 to 1 part by weight, per 100 parts by weight of the base resin. Less than 0.001 part of the basic compound achieves no or little addition effect whereas more than 2 parts would result in too low a sensitivity.

Other Components

In the positive resist composition, a compound having a group =C-COOH in the molecule may be blended. Exemplary, non-limiting compounds having a carboxyl group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced by —$R^{401}$—COOH (wherein $R^{401}$ is a straight or branched alkylene of 1 to 10 carbon atoms), and in which the molar ratio C/(C+D) of phenolic hydroxyl groups (C) to =C—COOH groups (D) in the molecule is from 0.1 to 1.0.

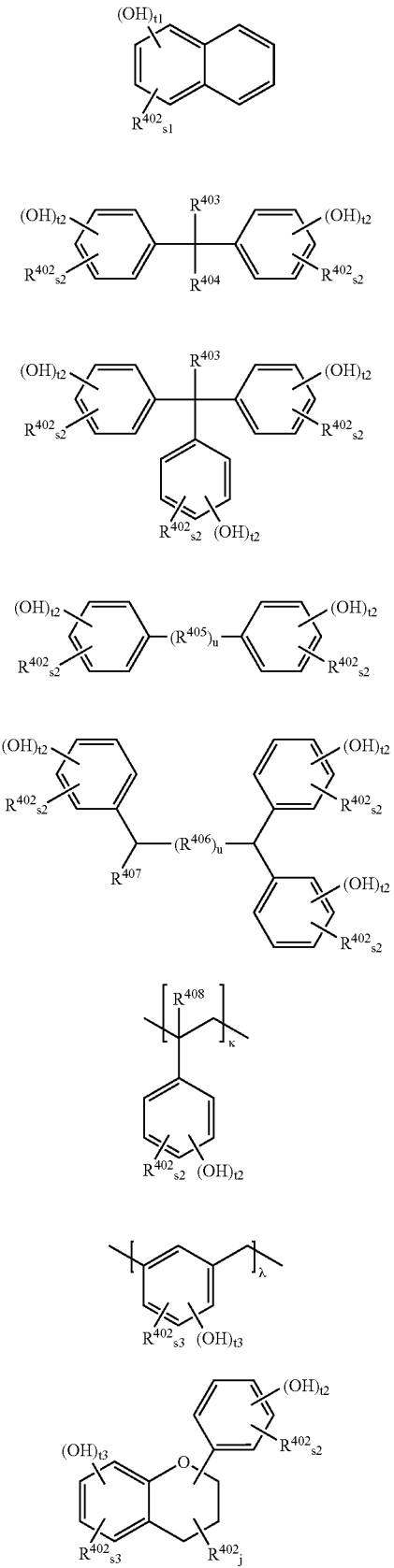

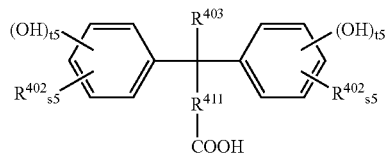

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkyl or alkenyl or a —$R^{411}$—COOH group; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; h is an integer of 1 to 4, j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:
Compounds of general formulas (A11) to (A15) below.

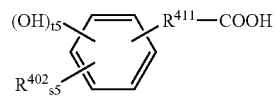

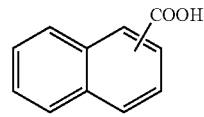

-continued (A14)

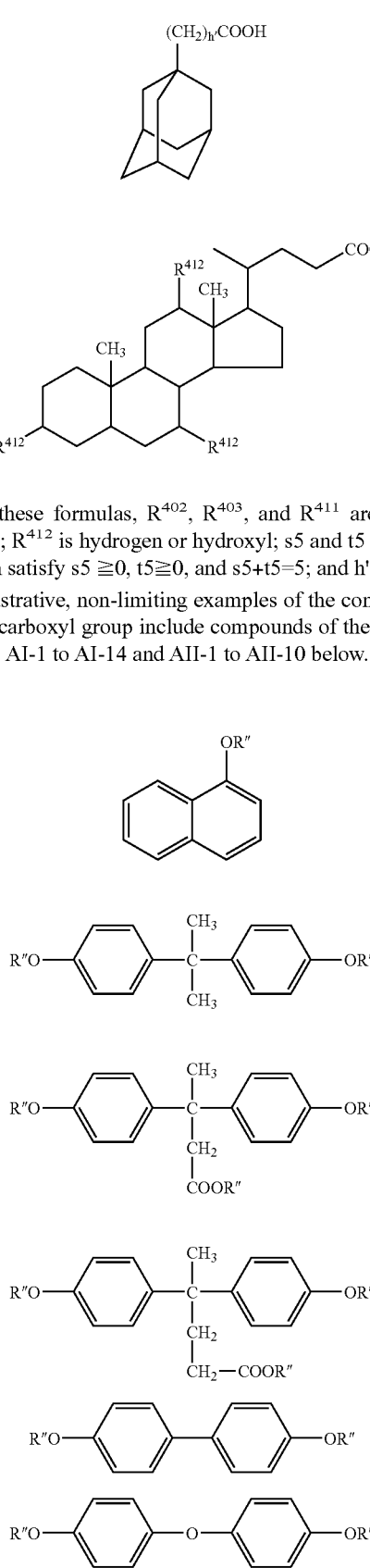

(A15)

In these formulas, $R^{402}$, $R^{403}$, and $R^{411}$ are as defined above; $R^{412}$ is hydrogen or hydroxyl; s5 and t5 are numbers which satisfy $s5 \geqq 0$, $t5 \geqq 0$, and $s5+t5=5$; and h' is 0 or 1.

Illustrative, non-limiting examples of the compound having a carboxyl group include compounds of the general formulas AI-1 to AI-14 and AII-1 to AII-10 below.

(AI-1)

(AI-2)

(AI-3)

(AI-4)

(AI-5)

(AI-6)

-continued

(AI-7)

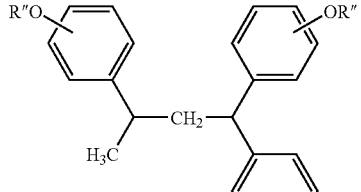

(AI-8)

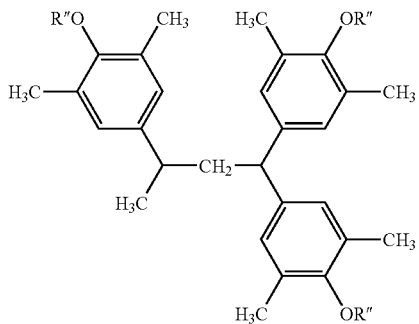

(AI-9)

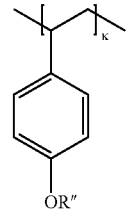

(AI-10)

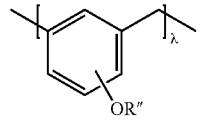

(AI-11)

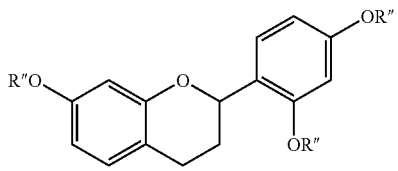

(AI-12)

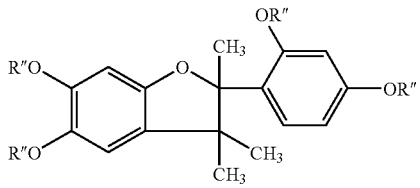

(AI-13)

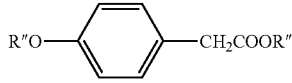

(AI-14)

In the above formulas, R" is hydrogen or a —CH$_2$COOH group such that the —CH$_2$COOH group accounts for 10 to 100 mol % of R" in each compound, κ and λ are as defined above.

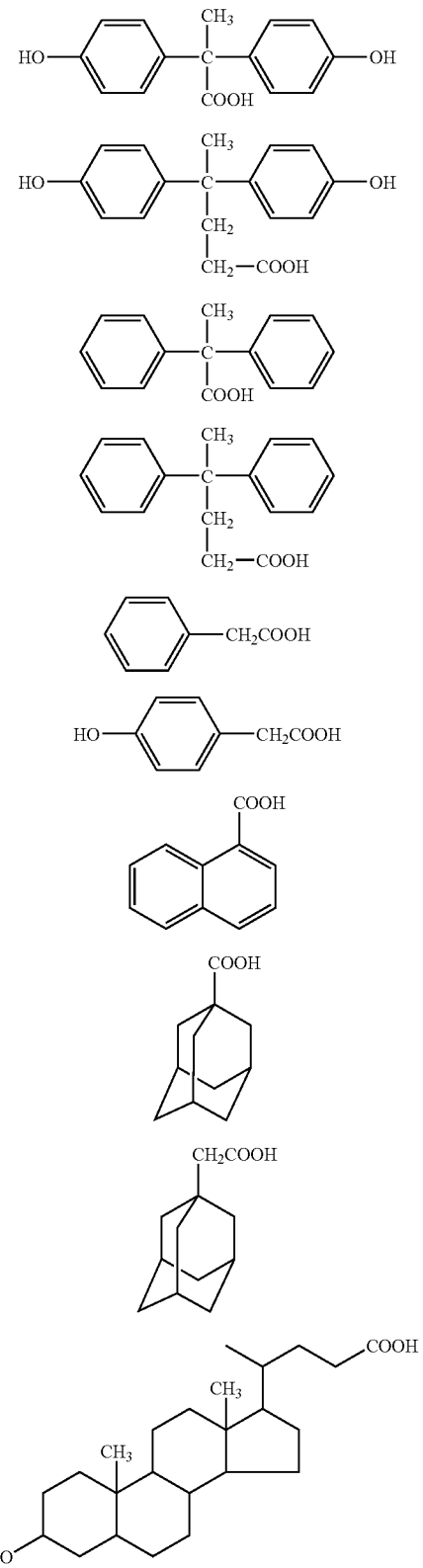

(AII-1)
(AII-2)
(AII-3)
(AII-4)
(AII-5)
(AII-6)
(AII-7)
(AII-8)
(AII-9)
(AII-10)

The compound is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The positive resist composition of the invention may further include a surfactant which is commonly used for improving the coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

To the positive resist composition, the surfactant is added in an amount of up to 2 parts, preferably up to 1 part by weight, per 100 parts by weight of the base resin.

For the microfabrication of integrated circuits, any well-known lithography may be used to form a resist pattern from the positive resist composition of the invention, especially the chemically amplified positive resist composition comprising the polymer, organic solvent, photoacid generator and optional components according to the invention although the technology is not limited thereto.

The composition is applied onto a substrate (on which an integrated circuit is to be formed, e.g., Si, $SiO_2$, SiN, SiON, TiN, WSi, BPSG, SOG, organic antireflective film, Cr, CrO, CrON, MoSi, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 µm thick. With a mask having a desired pattern placed above the resist film, the resist film is then exposed to actinic radiation such as UV, deep-UV, electron beams, x-rays, excimer laser light, γ-rays and synchrotron radiation, preferably having an exposure wavelength of up to 300 nm, more preferably 180 to 200 nm. The exposure dose is preferably about 1 to 200 $mJ/cm^2$, more preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate. It is appreciated that the resist composition of the invention is suited for micro-patterning using such high-energy radiation as deep UV with a wavelength of 254 to 193 nm, vacuum UV with a wavelength of 157 nm, electron beams, soft x-rays, x-rays, excimer laser light, γ-rays and synchrotron radiation, and best suitable for micro-patterning using high-energy radiation in the wavelength range of up to 200 nm, especially 180 to 200 nm.

Immersion lithography can be applied to the resist composition of the invention. The ArF immersion lithography uses deionized water as the immersion solvent. The immersion lithography involves prebaking a resist film and exposing the resist film to light through a projection lens, with water interposed between the resist film and the projection lens. Since the immersion lithography increases the numerical aperture (NA) of the projection lens to 1.0 or higher and improves resolution, it is important for the ArF lithography to survive to the 65-nm node, with a further development thereof being accelerated. The lactone ring, which is used as a hydrophilic group in the prior art ArF resists, has solubility in both alkaline aqueous solution and water. When lactones and acid anhydrides (e.g., maleic anhydride and itaconic anhydride) having high solubility in water are used as the hydrophilic group, a problem arises during immersion in water that more water penetrates into the resist from its surface, whereby the resist surface is swollen. By contrast, hydroxynaphthalene is dissolvable in alkaline aqueous solution, but not at all in water, and it is thus believed that the influence of dissolution and swelling during liquid immersion is minimized.

EXAMPLE

Examples of the invention are given below by way of illustration and not by way of limitation. The abbreviations used herein are AIBN for 2,2'-azobisisobutyronitrile, GPC for gel permeation chromatography, NMR for nuclear magnetic resonance, Mw for weight average molecular weight, Mn for number average molecular weight, Mw/Mn for molecular weight distribution or dispersity, and PGMEA for propylene glycol monomethyl ether acetate. For all polymers, Mw and Mn are determined by GPC versus polystyrene standards.

Synthesis Example 1

A 100-mL flask was charged with 8.2 g of 3-ethyl-3-exo-tetracyclo[4.4.0.1$^{2,5}$.1$^{7,10}$]dodecanyl methacrylate, 9.0 g of 3-oxo-2,7-dioxatricyclo[4.2.1.0$^{4,8}$]nonan-9-yl methacrylate, 6.8 g of 5-hydroxy-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 21.8 g of a white polymer.

The polymer was analyzed by $^{13}$C-NMR, $^{1}$H-NMR, and GPC, with the results shown below.

Copolymer Composition Ratio (Molar Ratio)

3-ethyl-3-exo-tetracyclo[4.4.0.1$^{2,5}$.1$^{7,10}$]dodecanyl methacrylate: 3-oxo-2,7-dioxatricyclo[4.2.1.0$^{4,8}$]nonan-9-yl methacrylate: 5-hydroxy-1-naphthyl methacrylate=0.30:0.40:0.30

Mw=8,900

Mw/Mn=1.72

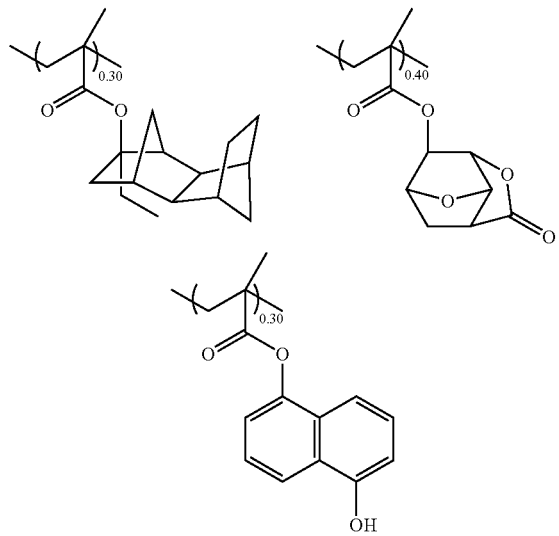

This polymer is designated Inventive Polymer 1.

Synthesis Example 2

A 100-mL flask was charged with 8.7 g of 2-ethyl-2-adamantane methacrylate, 5.0 g of 3-hydroxy-1-adamantyl methacrylate, 5.6 g of 3-oxo-2,7-dioxatricyclo[4.2.1.0$^{4,8}$]nonan-9-yl methacrylate, 4.6 g of 5-hydroxy-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 21.3 g of a white polymer.

The polymer was analyzed by $^{13}$C-NMR, $^{1}$H-NMR, and GPC, with the results shown below.

Copolymer Composition Ratio (Molar Ratio)

2-ethyl-2-adamantane methacrylate: 3-hydroxy-1-adamantyl methacrylate: 3-oxo-2,7-dioxatricyclo[4.2.1.0$^{4,8}$]nonan-9-yl methacrylate: 5-hydroxy-1-naphthyl methacrylate=0.35:0.20:0.25:0.20

Mw=8,900

Mw/Mn=1.78

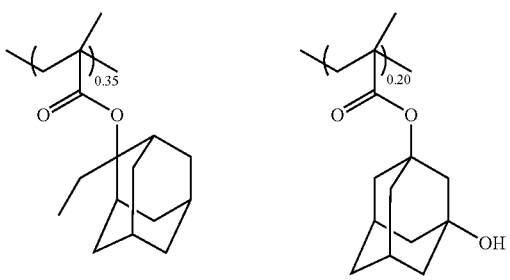

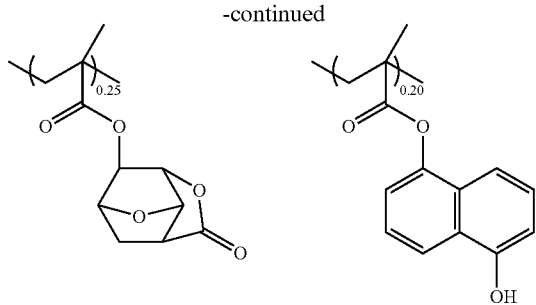

This polymer is designated Inventive Polymer 2.

Synthesis Example 3

A 100-mL flask was charged with 8.7 g of 2-ethyl-2-adamantane methacrylate, 5.0 g of 3-hydroxy-1-adamantyl methacrylate, 7.0 g of 3-oxo-5-methoxycarbonyl-2-oxatricyclo[4.2.1.0$^{4,8}$]-nonyl methacrylate, 4.6 g of 4-hydroxy-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 22.3 g of a white polymer.

The polymer was analyzed by $^{13}$C-NMR, $^1$H-NMR, and GPC, with the results shown below.

Copolymer Composition Ratio (Molar Ratio)
2-ethyl-2-adamantane methacrylate: 3-hydroxy-1-adamantyl methacrylate: 3-oxo-5-methoxycarbonyl-2-oxatricyclo[4.2.1.0$^{4,8}$]-9-nonyl methacrylate: 4-hydroxy-1-naphthyl methacrylate=0.35:0.20:0.25:0.20
Mw=7,700
Mw/Mn=1.73

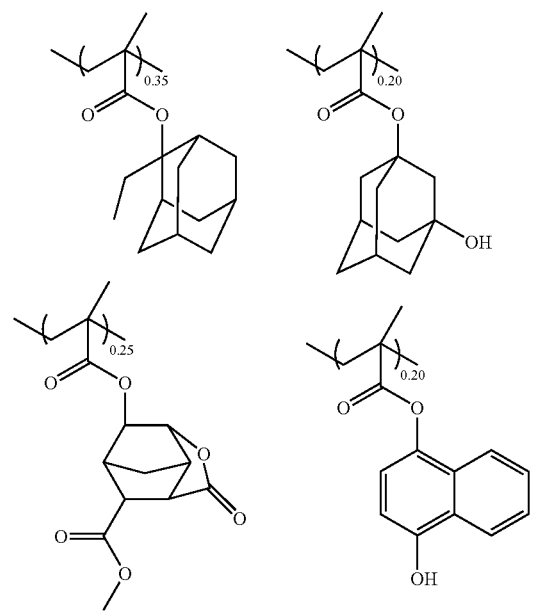

This polymer is designated Inventive Polymer 3.

Synthesis Example 4

A 100-mL flask was charged with 5.2 g of 1-cyclohexyl-cyclopentyl methacrylate, 5.0 g of 3-hydroxy-1-adamantyl methacrylate, 9.1 g of 3-oxo-2,7-dioxatricyclo[4.2.1.0$^{4,8}$] nonan-9-yl methacrylate, 4.6 g of 5-hydroxy-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 21.0 g of a white polymer.

The polymer was analyzed by $^{13}$C-NMR, $^1$H-NMR, and GPC, with the results shown below.

Copolymer Composition Ratio (Molar Ratio)
1-cyclohexylcyclopentyl methacrylate: 3-hydroxy-1-adamantyl methacrylate: 3-oxo-2,7-dioxatricyclo[4.2.1.0$^{4,8}$] nonan-9-yl methacrylate: 5-hydroxy-1-naphthyl methacrylate=0.22:0.20:0.38:0.20
Mw=7,800
Mw/Mn=1.73

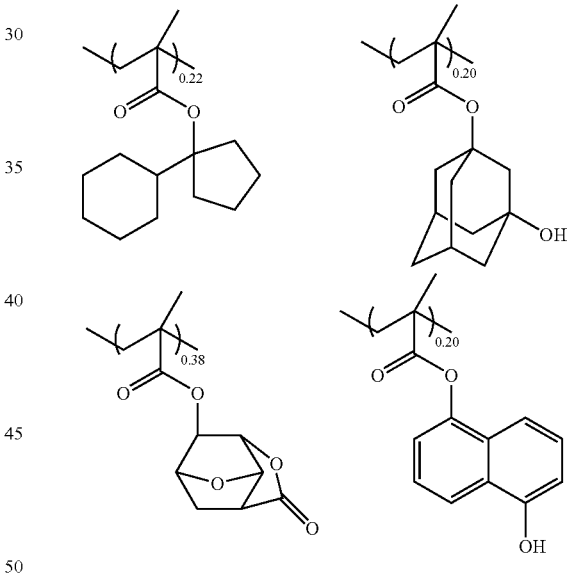

This polymer is designated Inventive Polymer 4.

Synthesis Example 5

A 100-mL flask was charged with 6.0 g of 1-ethylcyclopentyl methacrylate, 3.6 g of 3-hydroxy-1-adamantyl methacrylate, 6.6 g of 3-oxo-2,7-dioxatricyclo[4.2.1.0$^{4,8}$]nonan-9-yl methacrylate, 5.7 g of 5-hydroxy-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 18.7 g of a white polymer.

The polymer was analyzed by $^{13}$C-NMR, $^1$H-NMR, and GPC, with the results shown below.

Copolymer Composition Ratio (Molar Ratio)

1-ethylcyclopentyl methacrylate: 3-hydroxy-1-adamantyl methacrylate: 3-oxo-2,7-dioxatricyclo[4.2.1.0$^{4,8}$]nonan-9-yl methacrylate: 5-hydroxy-1-naphthyl methacrylate=0.33: 0.15:0.27:0.25

Mw=8,500
Mw/Mn=1.76

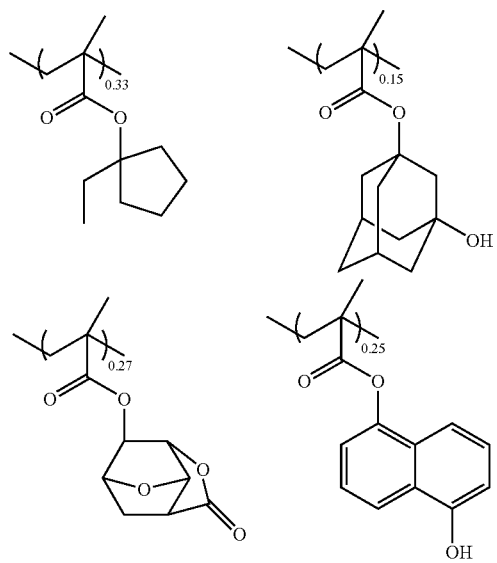

This polymer is designated Inventive Polymer 5.

Synthesis Example 6

A 100-mL flask was charged with 6.3 g of 1-(7-oxanorbornan-2-yl)cyclopentyl methacrylate, 5.0 g of 3-hydroxy-1-adamantyl methacrylate, 7.8 g of 3-oxo-2,7-dioxatricyclo [4.2.1.0$^{4,8}$]nonan-9-yl methacrylate, 4.6 g of 5-hydroxy-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 20.8 g of a white polymer.

The polymer was analyzed by $^{13}$C-NMR, $^1$H-NMR, and GPC, with the results shown below.

Copolymer Composition Ratio (Molar Ratio)

1-(7-oxanorbornan-2-yl)cyclopentyl methacrylate: 3-hydroxy-1-adamantyl methacrylate: 3-oxo-2,7-dioxatricyclo-[4.2.1.0$^{4,8}$]nonan-9-yl methacrylate: 5-hydroxy-1-naphthyl methacrylate=0.25:0.20:0.35:0.20

Mw=7,800
Mw/Mn=1.88

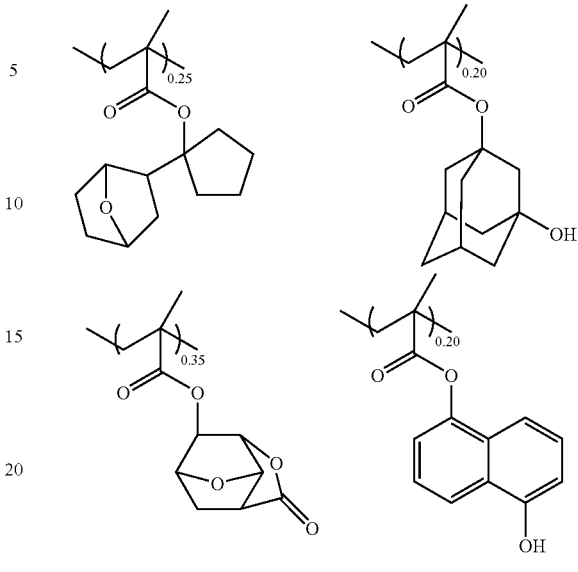

This polymer is designated Inventive Polymer 6.

Synthesis Example 7

A 100-mL flask was charged with 5.0 g of 2-adamantyloxymethyl methacrylate, 6.3 g of 3-hydroxy-1-adamantyl methacrylate, 6.7 g of 3-oxo-2,7-dioxatricyclo[4.2.1.0$^{4,8}$] nonan-9-yl methacrylate, 5.7 g of 5-hydroxy-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 20.6 g of a white polymer.

The polymer was analyzed by $^{13}$C-NMR, $^1$H-NMR, and GPC, with the results shown below.

Copolymer Composition Ratio (Molar Ratio)

2-adamantyloxymethyl methacrylate: 3-hydroxy-1-adamantyl methacrylate: 3-oxo-2,7-dioxatricyclo[4.2.1.0$^{4,8}$] nonan-9-yl methacrylate: 5-hydroxy-1-naphthyl methacrylate=0.21:0.25:0.29:0.25

Mw=9,100
Mw/Mn=1.83

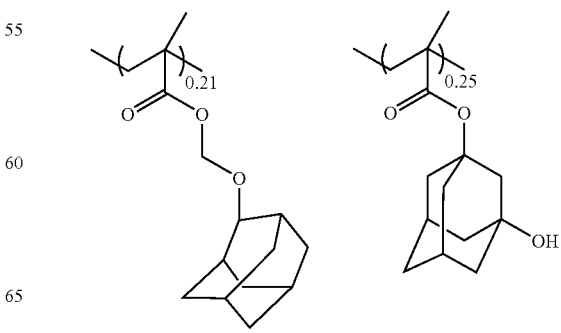

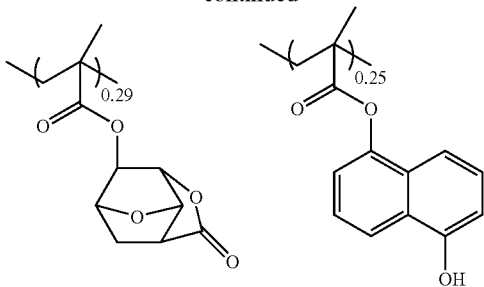

This polymer is designated Inventive Polymer 7.

Synthesis Example 8

A 100-mL flask was charged with 6.3 g of 3-hydroxy-1-adamantyl methacrylate, 7.8 g of 5-oxo-4-oxatricyclo[4.2.1.0$^{3,7}$]nonan-2-yl methacrylate, 12.5 g of 5-t-butoxycarbonyl-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 22.8 g of a white polymer.

The polymer was analyzed by $^{13}$C-NMR, $^{1}$H-NMR, and GPC, with the results shown below.

Copolymer Composition Ratio (Molar Ratio)

3-hydroxy-1-adamantyl methacrylate: 5-oxo-4-oxatricyclo-[4.2.1.0$^{3,7}$]nonan-2-yl methacrylate: 5-t-butoxycarbonyl-1-naphthyl methacrylate=0.26:0.34:0.40

Mw=8,100
Mw/Mn=1.67

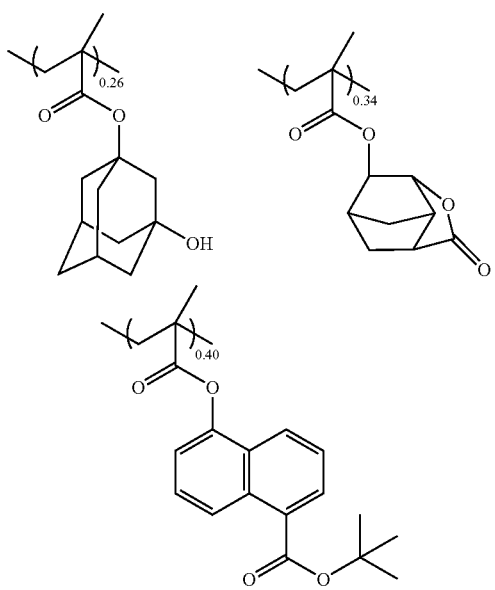

This polymer is designated Inventive Polymer 8.

Synthesis Example 9

A 100-mL flask was charged with 6.3 g of 3-hydroxy-1-adamantyl methacrylate, 8.8 g of 4-oxatricyclo[5.2.2.0$^{2,8}$]undecan-3-one 8(9)-methacrylate, 12.5 g of 5-t-butoxycarbonyl-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 24.0 g of a white polymer.

The polymer was analyzed by $^{13}$C-NMR, $^{1}$H-NMR, and GPC, with the results shown below.

Copolymer Composition Ratio (Molar Ratio)

3-hydroxy-1-adamantyl methacrylate: 4-oxatricyclo[5.2.2.0$^{2,8}$]undecan-3-one 8(9)-methacrylate: 5-t-butoxycarbonyl-1-naphthyl methacrylate=0.25:0.35:0.40

Mw=8,600
Mw/Mn=1.84

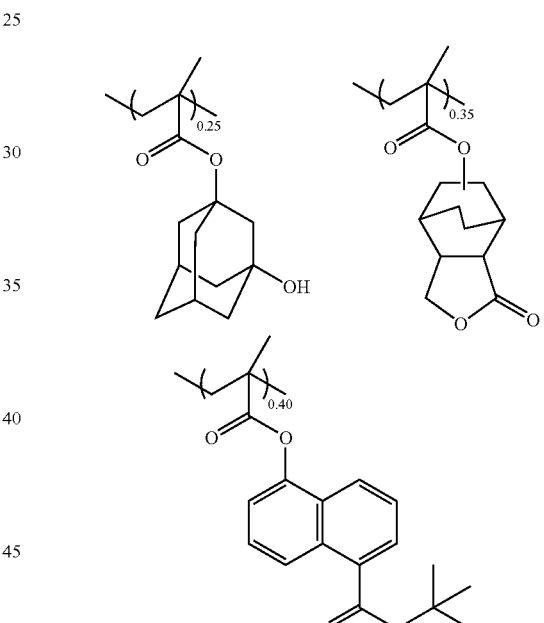

This polymer is designated Inventive Polymer 9.

Synthesis Example 10

A 100-mL flask was charged with 6.3 g of 3-hydroxy-1-adamantyl methacrylate, 8.8 g of spiro[methacrylic acid-5(6)-norbornane 2,3'-tetrahydrofuran-2-one], 12.5 g of 5-t-butoxycarbonyl-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 24.6 g of a white polymer.

The polymer was analyzed by $^{13}$C-NMR, $^{1}$H-NMR, and GPC, with the results shown below.

Copolymer Composition Ratio (Molar Ratio)
3-hydroxy-1-adamantyl methacrylate: spiro[methacrylic acid-5(6)-norbornane 2,3'-tetrahydrofuran-2-one]: 5-t-butoxycarbonyl-1-naphthyl methacrylate=0.25:0.35:0.40
Mw=8,900
Mw/Mn=1.72

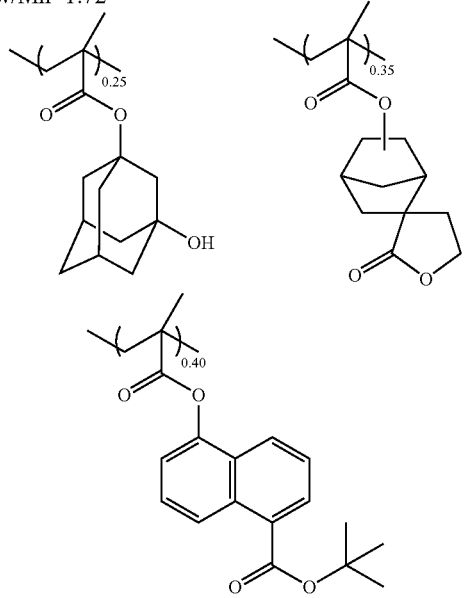

This polymer is designated Inventive Polymer 10.

Synthesis Example 11

A 100-mL flask was charged with 14.2 g of 3-ethyl-3-exotetracyclo[4.4.0.1$^{2,5}$.1$^{7,10}$]dodecanyl methacrylate, 35.3 g of 1-hydroxy-5-naphthyl methacrylate, and 40 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 33.8 g of a white polymer.

The polymer was analyzed by $^{13}$C-NMR, $^{1}$H-NMR, and GPC, with the results shown below.

Copolymer Composition Ratio (Molar Ratio)
3-ethyl-3-exotetracyclo[4.4.0.1$^{2,5}$.1$^{7,10}$]dodecanyl methacrylate: 1-hydroxy-5-naphthyl methacrylate=0.25:0.75
Mw=8,900
Mw/Mn=1.45

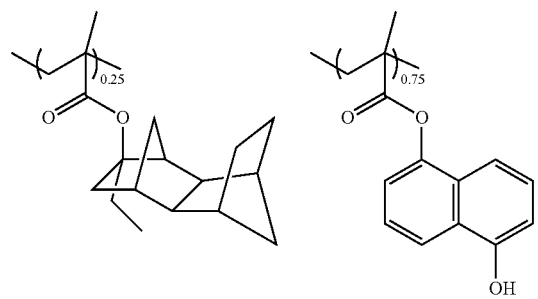

This polymer is designated Inventive Polymer 11.

Synthesis Example 12

A 100-mL flask was charged with 14.2 g of 3-ethyl-3-exotetracyclo[4.4.0.1$^{2,5}$.1$^{7,10}$]dodecanyl methacrylate, 14.8 g of 1-hydroxy-5-naphthyl methacrylate, 20 g of 4-hydroxystyrene, and 40 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 36.8 g of a white polymer.

The polymer was analyzed by $^{13}$C-NMR, $^{1}$H-NMR, and GPC, with the results shown below.

Copolymer Composition Ratio (Molar Ratio)
3-ethyl-3-exotetracyclo[4.4.0.1$^{2,5}$.1$^{7,10}$]dodecanyl methacrylate: 1-hydroxy-5-naphthyl methacrylate: 4-hydroxystyrene=0.25:0.37:0.38
Mw=9,300
Mw/Mn=1.63

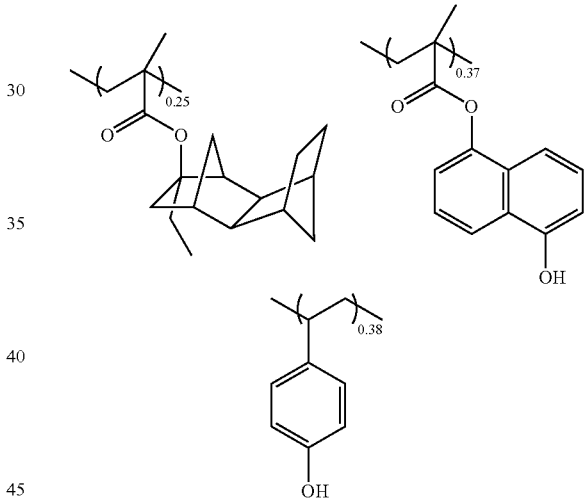

This polymer is designated Inventive Polymer 12.

Synthesis Example 13

A 100-mL flask was charged with 8.7 g of 2-ethyl-2-adamantane methacrylate, 5.0 g of 3-hydroxy-1-adamantyl methacrylate, 5.6 g of 3-oxo-2,7-dioxatricyclo[4.2.1.0$^{4,8}$]nonan-9-yl methacrylate, 4.8 g of 5-carboxyl-1-naphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 21.3 g of a white polymer.

The polymer was analyzed by $^{13}$C-NMR, $^{1}$H-NMR, and GPC, with the results shown below.

Copolymer Composition Ratio (Molar Ratio)
2-ethyl-2-adamantane methacrylate: 3-hydroxy-1-adamantyl methacrylate: 3-oxo-2,7-dioxatricyclo[4.2.1.0$^{4,8}$]nonan-9-yl methacrylate: 5-carboxyl-1-naphthyl methacrylate=0.35:0.20:0.25:0.20

Mw=8,600
Mw/Mn=1.76

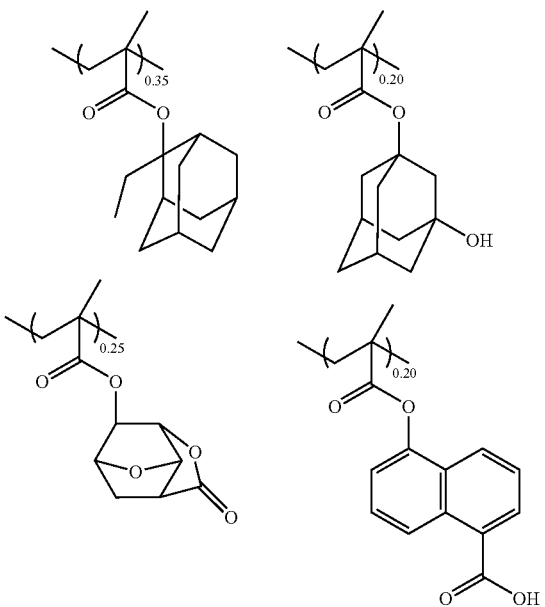

This polymer is designated Inventive Polymer 13.

Synthesis Example 14

A 100-mL flask was charged with 6.8 g of 3-ethyl-3-exotetracyclo[4.4.0.1$^{2,5}$.1$^{7,10}$]dodecanyl methacrylate, 5.9 g of 3-hydroxy-1-adamantyl methacrylate, 7.8 g of 3-oxo-2,7-dioxatricyclo[4.2.1.0$^{4,8}$]nonan-9-yl methacrylate, 4.8 g of 5-hydroxy-1-methylnaphthyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 22.3 g of a white polymer.

The polymer was analyzed by $^{13}$C-NMR, $^1$H-NMR, and GPC, with the results shown below.

Copolymer Composition Ratio (Molar Ratio)
3-ethyl-3-exotetracyclo[4.4.0.1$^{2,5}$.1$^{7,10}$]dodecanyl methacrylate: 3-hydroxy-1-adamantyl methacrylate: 3-oxo-2,7-dioxatricyclo[4.2.1.0$^{4,8}$]nonan-9-yl methacrylate: 5-hydroxy-1-methylnaphthyl methacrylate=0.25:0.25:0.35:0.20

Mw=8,900
Mw/Mn=1.69

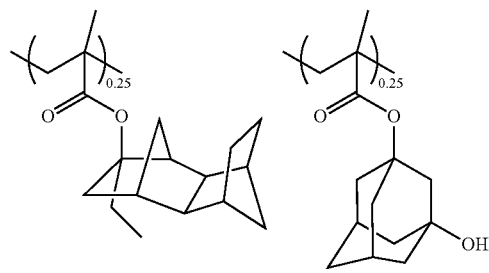

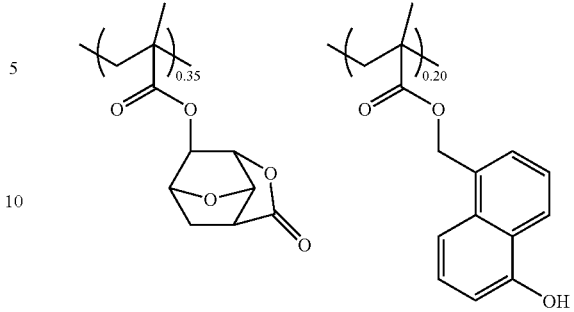

This polymer is designated Inventive Polymer 14.

Synthesis Example 15

A 100-mL flask was charged with 6.8 g of 3-ethyl-3-exotetracyclo[4.4.0.1$^{2,5}$.1$^{7,10}$]dodecanyl methacrylate, 5.9 g of 3-hydroxy-1-adamantyl methacrylate, 7.8 g of 3-oxo-2,7-dioxatricyclo[4.2.1.0$^{4,8}$]nonan-9-yl methacrylate, 5.7 g of 5-hydroxy-1-yloxycarbonylmethyl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 23.5 g of a white polymer.

The polymer was analyzed by $^{13}$C-NMR, $^1$H-NMR, and GPC, with the results shown below.

Copolymer Composition Ratio (Molar Ratio)
3-ethyl-3-exotetracyclo[4.4.0.1$^{2,5}$.1$^{7,10}$]dodecanyl methacrylate: 3-hydroxy-1-adamantyl methacrylate: 3-oxo-2,7-dioxatricyclo[4.2.1.0$^{4,8}$]nonan-9-yl methacrylate: 5-hydroxy-1-yloxycarbonylmethyl methacrylate=0.25:0.25:0.35:0.20

Mw=9,100
Mw/Mn=1.73

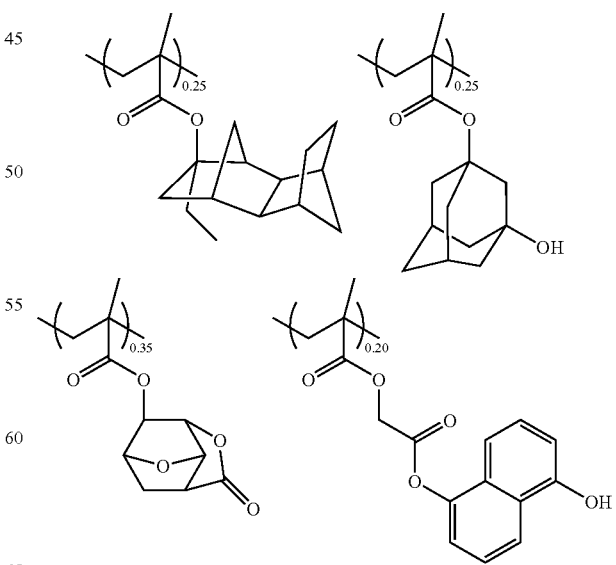

This polymer is designated Inventive Polymer 15.

Comparative Synthesis Example 1

A 100-mL flask was charged with 8.7 g of 2-ethyl-2-adamantane methacrylate, 7.5 g of 3-hydroxy-1-adamantyl methacrylate, 7.3 g of 5-oxo-4-oxatricyclo[4.2.1.0$^{3,7}$]nonan-2-yl methacrylate, and 30 g of tetrahydrofuran as a solvent. The reactor was subjected to cooling to −70° C. in a nitrogen atmosphere, evacuation to vacuum, and nitrogen flow, which procedure was repeated three times. The reactor was warmed up to room temperature, charged with 0.2 g of AIBN as a polymerization initiator, heated at 60° C., and held for 15 hours for reaction. The reaction solution was poured into 500 mL of isopropyl alcohol for precipitation. The white solids were collected by filtration and dried at 60° C. under reduced pressure, yielding 19.5 g of a white polymer.

The polymer was analyzed by $^{13}$C-NMR, $^1$H-NMR, and GPC, with the results shown below.

Copolymer Composition Ratio (Molar Ratio)

2-ethyl-2-adamantane methacrylate: 3-hydroxy-1-adamantyl methacrylate: 5-oxo-4-oxatricyclo[4.2.1.0$^{3,7}$]nonan-2-yl methacrylate=0.35:0.30:0.35

Mw=8,900

Mw/Mn=1.83

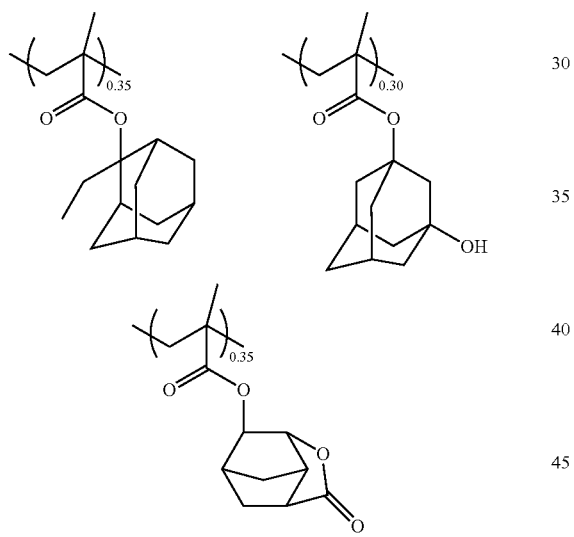

This polymer is designated Comparative Polymer 1.

Examples and Comparative Examples

Preparation of Positive Resist Compositions

Resist solutions were prepared by dissolving the polymer (Inventive Polymers 1 to 10, 13 to 15 and Comparative Polymer 1) and other components in a solvent in accordance with the formulation shown in Table 1 and passing through a filter with a pore size of 0.2 μm. The components in Table 1 are as follows.

Polymer:

Inventive Polymers 1 to 10 and 13 to 15
resulting from Synthesis Examples 1 to 10 and 13 to 15
Comparative Polymer 1
resulting from Comparative Synthesis Example 1

Photoacid Generator:
PAG1 to PAG4 of the following structural formulae

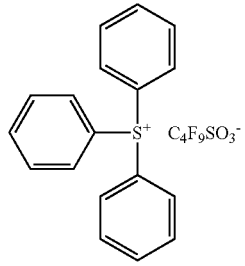

PAG1

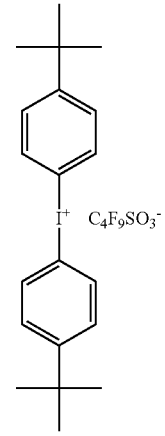

PAG2

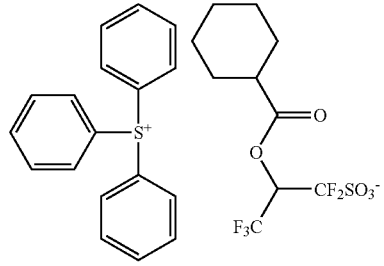

PAG3

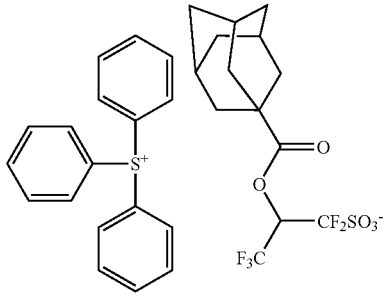

PAG4

Basic Compound:
triethanolamine, TMMEA, AAA, and AACN of the following structural formulae

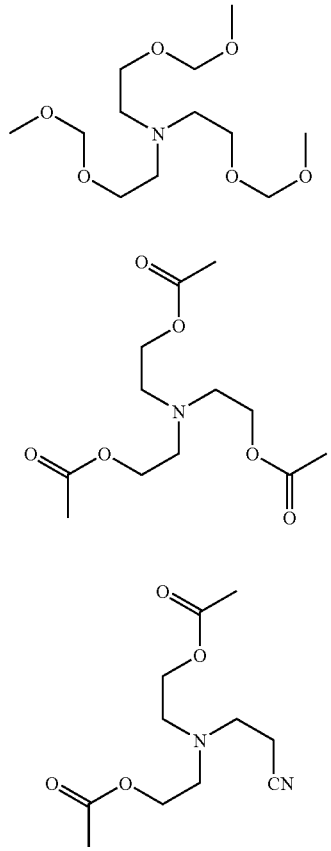

Dissolution Inhibitor:
DRI1 of the following structural formula

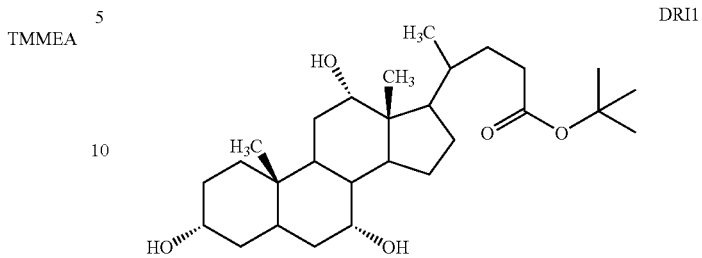

Organic Solvent:
PGMEA

Exposure/Patterning

On silicon wafers which had been hexamethyldisilazane (HMDS) vapor primed, the resist solutions (Examples 1-19, Comparative Example 1) were spin coated, then baked on a hot plate at 120° C. for 60 seconds to give resist films having a thickness of 250 nm.

The resist films were exposed by means of an ArF excimer laser stepper model NSR-S305B (Nikon Corp., NA 0.68, σ 0.85, 2/3 annular illumination, 6% halftone phase shift mask). Immediately after exposure, the resist films were baked (PEB) at 110° C. for 60 seconds and then developed for 60 seconds with a 2.38% aqueous solution of tetramethylammonium hydroxide, obtaining positive patterns.

The resist patterns were evaluated. The exposure dose (mJ/cm$^2$) which provided a 1:1 resolution to a 0.12-μm line-and-space pattern was the sensitivity. The minimum line width (nm) of a L/S pattern which was ascertained separate at this dose was the resolution of a test resist. Using a measuring SEM model S-9220 (Hitachi Ltd.), the 0.12-μm L/S pattern was measured for line edge roughness. A cross section of the resist was observed under a SEM model S4200 (Hitachi Ltd.). The results are also shown in Table 1.

TABLE 1

| | Polymer (pbw) | Photoacid generator (pbw) | Basic compound (pbw) | Dissolution inhibitor (pbw) | Solvent (pbw) | Sensitivity (mJ/cm$^2$) | Resolution (μm) | Pattern profile | Line edge roughness (3σ, nm) |
|---|---|---|---|---|---|---|---|---|---|
| Example 1 | Inventive Polymer 1 (100) | PAG1 (4.5) | triethanolamine (0.45) | — | PGMEA (800) | 32 | 0.11 | rectangular | 7.2 |
| Example 2 | Inventive Polymer 2 (100) | PAG1 (4.5) | triethanolamine (0.45) | — | PGMEA (800) | 31 | 0.11 | rectangular | 6.1 |
| Example 3 | Inventive Polymer 3 (100) | PAG1 (4.5) | triethanolamine (0.45) | — | PGMEA (800) | 35 | 0.11 | rectangular | 7.8 |
| Example 4 | Inventive Polymer 4 (100) | PAG1 (4.5) | triethanolamine (0.45) | — | PGMEA (800) | 31 | 0.11 | rectangular | 7.6 |
| Example 5 | Inventive Polymer 5 (100) | PAG1 (4.5) | triethanolamine (0.45) | — | PGMEA (800) | 26 | 0.11 | rectangular | 7.9 |
| Example 6 | Inventive Polymer 6 (100) | PAG1 (4.5) | triethanolamine (0.45) | — | PGMEA (800) | 33 | 0.11 | rectangular | 7.2 |
| Example 7 | Inventive Polymer 7 (100) | PAG1 (4.5) | triethanolamine (0.45) | — | PGMEA (800) | 22 | 0.11 | rectangular | 6.9 |
| Example 8 | Inventive Polymer 8 (100) | PAG1 (2.5) | triethanolamine (0.45) | — | PGMEA (800) | 33 | 0.11 | rectangular | 6.8 |
| Example 9 | Inventive Polymer 9 (100) | PAG1 (4.5) | triethanolamine (0.45) | — | PGMEA (800) | 32 | 0.11 | rectangular | 6.8 |
| Example 10 | Inventive Polymer 10 (100) | PAG1 (4.5) | triethanolamine (0.45) | — | PGMEA (800) | 36 | 0.11 | rectangular | 6.8 |
| Example 11 | Inventive Polymer 13 (100) | PAG1 (4.5) | triethanolamine (0.45) | — | PGMEA (800) | 39 | 0.11 | rectangular | 7.3 |
| Example 12 | Inventive Polymer 14 (100) | PAG3 (4.5) | triethanolamine (0.45) | — | PGMEA (800) | 34 | 0.11 | rectangular | 6.5 |

TABLE 1-continued

| | Polymer (pbw) | Photoacid generator (pbw) | Basic compound (pbw) | Dissolution inhibitor (pbw) | Solvent (pbw) | Sensitivity (mJ/cm$^2$) | Resolution (μm) | Pattern profile | Line edge roughness (3σ, nm) |
|---|---|---|---|---|---|---|---|---|---|
| Example 13 | Inventive Polymer 15 (100) | PAG4 (4.5) | triethanolamine (0.45) | — | PGMEA (800) | 32 | 0.11 | rectangular | 6.5 |
| Example 14 | Inventive Polymer 2 (100) | PAG1 (4.5) | TMMEA (0.6) | — | PGMEA (800) | 29 | 0.11 | rectangular | 6.5 |
| Example 15 | Inventive Polymer 2 (100) | PAG1 (4.5) | AAA (0.6) | — | PGMEA (800) | 28 | 0.11 | rectangular | 6.8 |
| Example 16 | Inventive Polymer 2 (100) | PAG1 (4.5) | AACN (0.6) | — | PGMEA (800) | 33 | 0.11 | rectangular | 6.8 |
| Example 17 | Inventive Polymer 2 (100) | PAG1 (4.5) | triethanolamine (0.45) | DRI1 (10) | PGMEA (800) | 28 | 0.11 | rectangular | 6.3 |
| Example 18 | Inventive Polymer 2 (50) Comparative Polymer 1 (50) | PAG1 (4.5) | triethanolamine (0.45) | — | PGMEA (800) | 28 | 0.11 | rectangular | 7.6 |
| Example 19 | Inventive Polymer 2 (100) | PAG2 (5.5) | triethanolamine (0.30) | — | PGMEA (800) | 38 | 0.11 | rectangular | 8.5 |
| Comparative Example 1 | Comparative Polymer 1 (100) | PAG1 (4.5) | triethanolamine (0.45) | — | PGMEA (800) | 28 | 0.12 | rectangular | 10.5 |

It is evident from Table 1 that the resist compositions of Examples 1 to 19 exhibit a high resolution. Particularly when the underlay is a highly reflective substrate such as silicon substrate, irregularities due to generation of standing waves are minimized, leading to minimized line edge roughness.

EB Writing Test

Positive resist compositions were prepared in accordance with the formulation shown in Table 2 by using the polymers synthesized above, dissolving the polymers and other components in a solvent, and filtering through a filter having a pore size of 0.2 μm. It is noted that Inventive Polymers 11 and 12 are obtained in Synthesis Examples 11 and 12, and the other components are the same as in the foregoing Examples.

Using Clean Track Mark 5 (Tokyo Electron Ltd.), the resist solutions were spin-coated onto 6-inch silicon substrates and pre-baked on a hot plate at 110° C. for 90 seconds to form a resist film of 100 nm thick. Using an e-beam direct writing system HL-800D by Hitachi Ltd., image writing was performed in a vacuum chamber at a HV voltage of 50 keV.

Immediately after the image writing, post-exposure baking (PEB) was effected on a hot plate at 110° C. for 90 seconds, using Clean Track Mark 5 (Tokyo Electron Ltd.). This was followed by puddle development in an aqueous solution of 2.38 wt % tetramethylammonium hydroxide (TMAH) for 30 seconds, giving positive patterns.

The resulting resist patterns were evaluated. The sensitivity was the exposure dose (μC/cm$^2$) which provided a 1:1 resolution at the top and bottom of a 0.12-μm line-and-space pattern. The minimum line width (nm) of a L/S pattern which was ascertained separate at this dose was the resolution of a test resist.

Table 2 reports the formulation of resist compositions and the results of sensitivity and resolution thereof upon EB writing.

TABLE 2

| | Polymer (pbw) | Photoacid generator (pbw) | Base (pbw) | Solvent (pbw) | Sensitivity (μC/cm$^2$) | Resolution (μm) |
|---|---|---|---|---|---|---|
| Example 20 | Inventive Polymer 11 (100) | PAG1 (10.0) | triethanolamine (0.2) | PGMEA (1,000) | 12 | 0.08 |
| Example 21 | Inventive Polymer 12 (100) | PAG1 (10.0) | triethanolamine (0.2) | PGMEA (1,000) | 10 | 0.08 |
| Comparative Example 2 | Comparative Polymer 1 (100) | PAG1 (10.0) | triethanolamine (0.2) | PGMEA (1,000) | 20 | 0.12 |

The data of Table 2 demonstrate that the resist compositions of Examples 20 and 21 have a high sensitivity and high resolution.

Dry Etching Test

Each polymer, 2 g, was thoroughly dissolved in 10 g of PGMEA, and passed through a filter having a pore size of 0.2 μm, obtaining a polymer solution. The polymer solution was spin coated onto a silicon substrate and baked, forming a polymer film of 300 nm thick. Dry etching tests were carried out on the polymer films by etching them under two sets of conditions.

(1) CHF$_3$/CF$_4$ Gas Etching Test

Using a dry etching instrument TE-8500P (Tokyo Electron K.K.), the polymer film was etched with CHF$_3$/CF$_4$ gas under the following conditions. The difference in polymer film thickness before and after etching was determined.

| | |
|---|---|
| Chamber pressure | 40.0 Pa |
| RF power | 1000 W |
| Gap | 9 mm |
| CHF$_3$ gas flow rate | 30 ml/min |
| CF$_4$ gas flow rate | 30 ml/min |
| Ar gas flow rate | 100 ml/min |
| Time | 60 sec |

(2) Cl$_2$/BCl$_3$ Gas Etching Test

Using a dry etching instrument L-507D-L (Nichiden Anerba K.K.), the polymer film was etched with Cl$_2$/BCl$_3$ gas under the following conditions. The difference in polymer film thickness before and after etching was determined.

| | |
|---|---|
| Chamber pressure | 40.0 Pa |
| RF power | 300 W |
| Gap | 9 mm |
| Cl$_2$ gas flow rate | 30 ml/min |
| BCl$_3$ gas flow rate | 30 ml/min |
| CHF$_3$ gas flow rate | 100 ml/min |
| O$_2$ gas flow rate | 2 ml/min |
| Time | 60 sec |

The results of the etching tests are shown in Table 3.

TABLE 3

| Polymer | CHF$_3$/CF$_4$ gas etching rate (nm/min) | Cl$_2$/BCl$_3$ gas etching rate (nm/min) |
|---|---|---|
| Inventive Polymer 1 | 132 | 182 |
| Inventive Polymer 2 | 138 | 186 |
| Inventive Polymer 3 | 133 | 168 |
| Inventive Polymer 4 | 135 | 163 |
| Inventive Polymer 5 | 149 | 177 |
| Inventive Polymer 6 | 150 | 203 |
| Inventive Polymer 7 | 140 | 221 |
| Inventive Polymer 8 | 132 | 189 |
| Inventive Polymer 9 | 133 | 182 |
| Inventive Polymer 10 | 128 | 178 |
| Inventive Polymer 11 | 110 | 133 |
| Inventive Polymer 12 | 108 | 131 |
| Inventive Polymer 13 | 141 | 190 |
| Inventive Polymer 14 | 146 | 193 |
| Inventive Polymer 15 | 151 | 209 |
| Comparative Polymer 1 | 158 | 350 |

As is evident from Tables 1-3, resist compositions using inventive polymers not only exhibit an excellent sensitivity and resolution, and minimized line edge roughness, but also have good dry etching resistance as demonstrated by a minimized difference in film thickness after etching.

Japanese Patent Application Nos. 2005-274163 and 2006-114084 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising a polymer comprising at least recurring units of the general formulae (a) and (b):

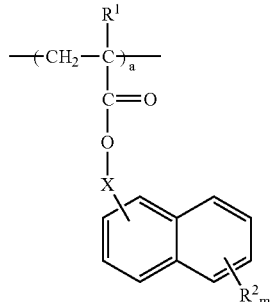

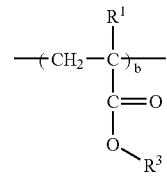

wherein $R^1$ is each independently hydrogen or methyl, $R^2$ is a hydroxy group, acid labile group-substituted hydroxy group, carboxyl group, or acid labile group-substituted carboxyl group, $R^3$ is a lactone-containing adhesive group, X is a single bond, m is 1 or 2, a and b are numbers in the range: $0<a<1.0$ and $0<b\leq0.8$, said lactone-containing adhesive group, as represented by $R^3$, being selected from the group consisting of the following formulae:

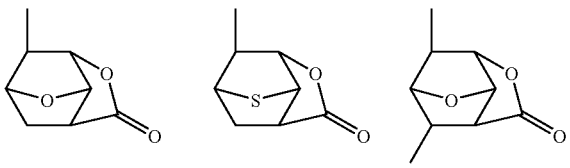

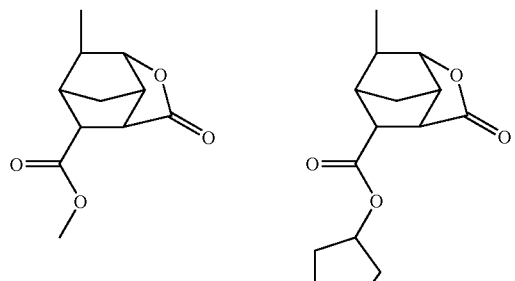

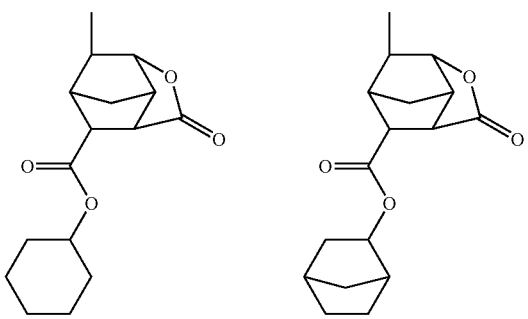

-continued

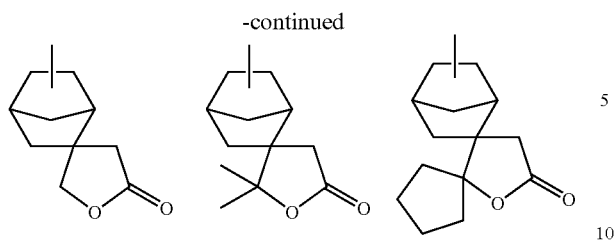
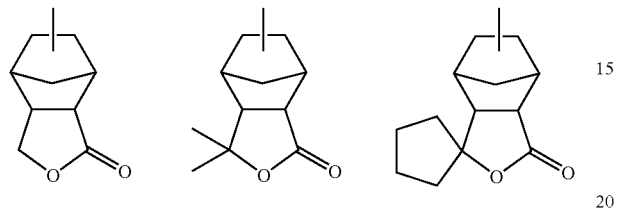
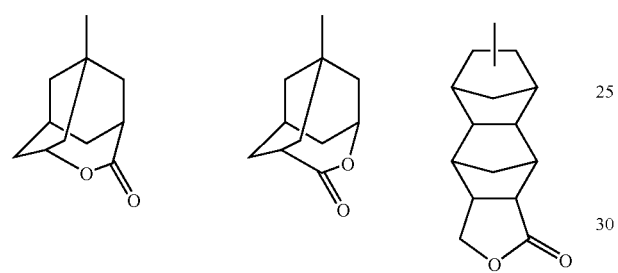
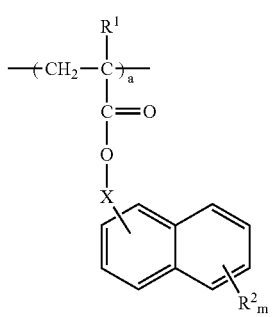
and

2. The positive resist composition of claim 1 comprising a polymer comprising at least recurring units of the general formulae (a), (b) and (c):

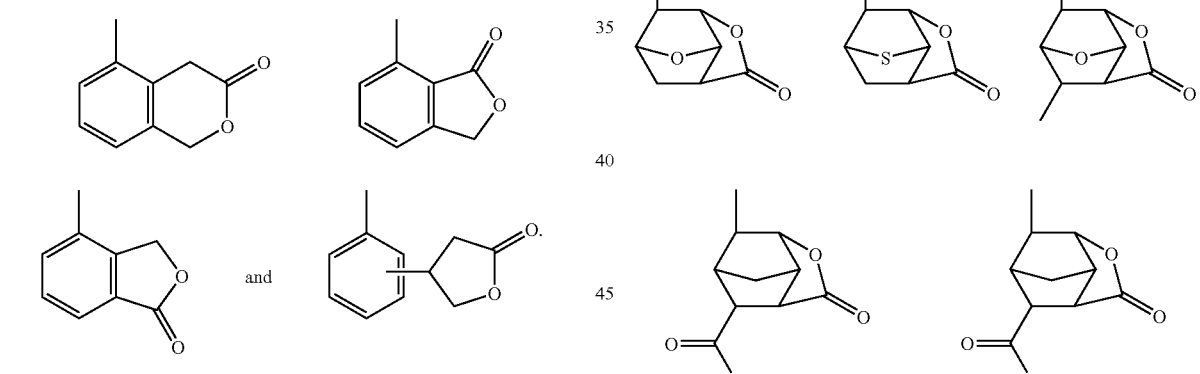

-continued wherein $R^1$ is each independently hydrogen or methyl, $R^2$ is a hydroxy group, acid labile group-substituted hydroxy group, carboxyl group, or acid labile group-substituted carboxyl group, $R^{3A}$ is a lactone-containing adhesive group, $R^{3B}$ is an acid labile group, X is a single bond, m is 1 or 2, a, b and c are numbers in the range: $0<a<1.0$, $0<b\leqq0.8$, $0<c\leqq0.8$, and $0<b+c\leqq0.8$, said lactone-containing adhesive group, as represented by $R^{3A}$, being selected from the group consisting of the following formulae:

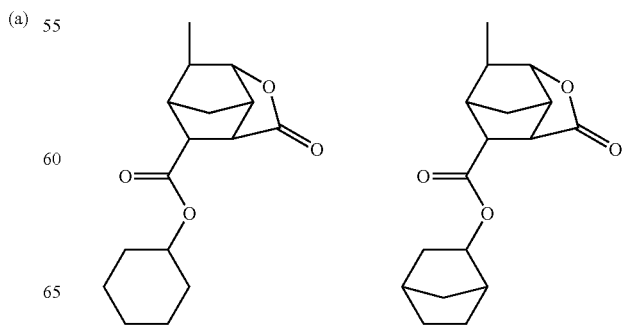

-continued

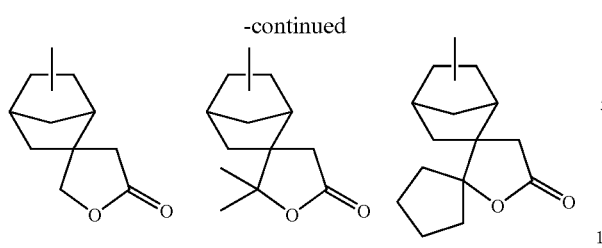

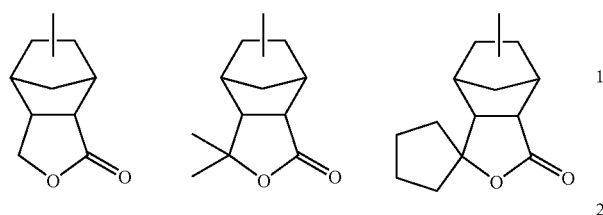

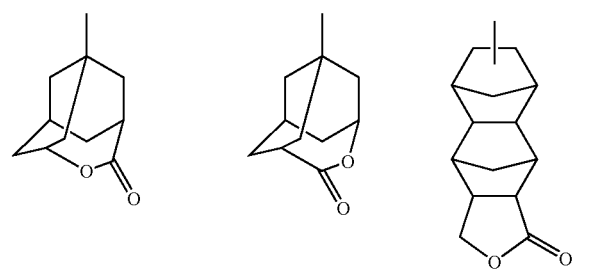

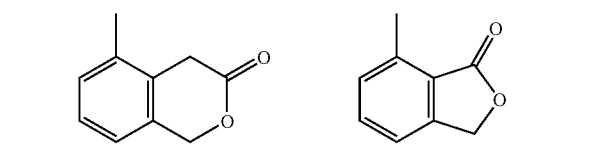

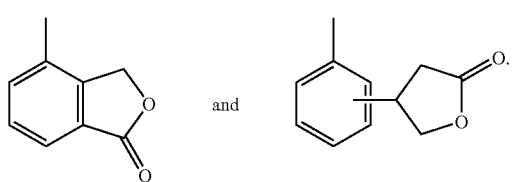

and

3. The positive resist composition of claim 1, further comprising an organic solvent and a photoacid generator, and serving as a chemically amplified resist composition.

4. The resist composition of claim 3, further comprising a dissolution inhibitor.

5. The resist composition of claim 3, further comprising a basic compound and/or a surfactant.

6. A process for forming a pattern comprising the steps of applying the resist composition of claim 1 onto a substrate, heat treating, exposing to high-energy radiation, and developing with a developer.

7. The pattern forming process of claim 6 wherein the high-energy radiation has a wavelength of up to 200 nm.

8. The positive resist composition of claim 1 which further comprises a recurring unit derived from a monomer selected from the group consisting of the following formulae:

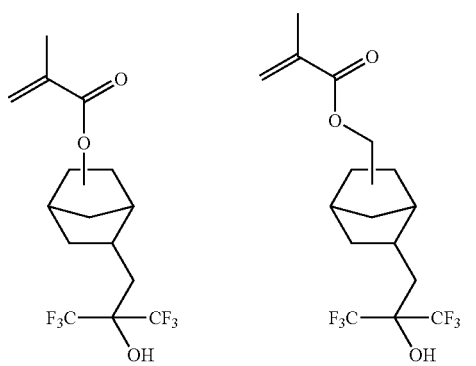

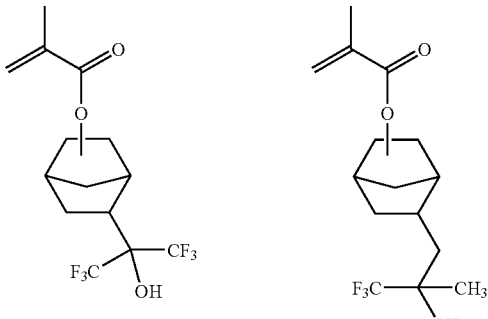

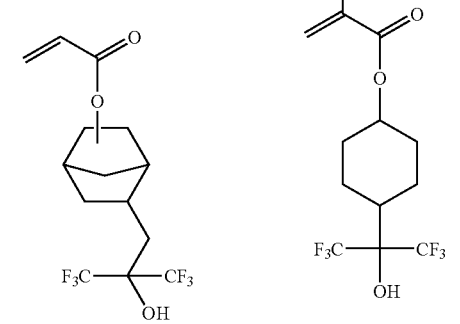

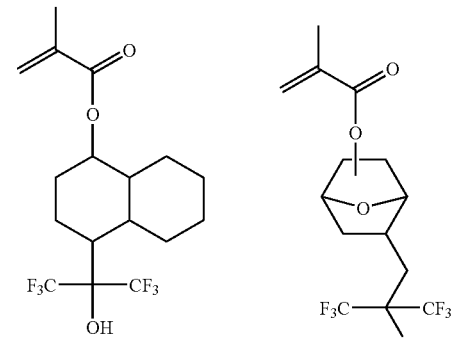

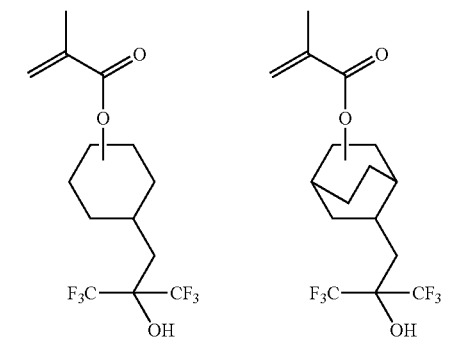

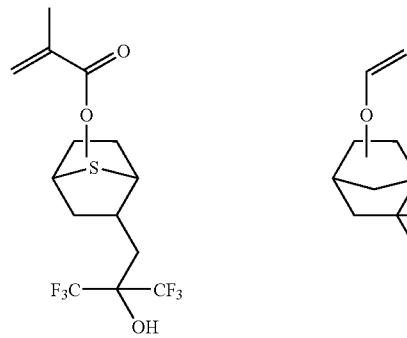
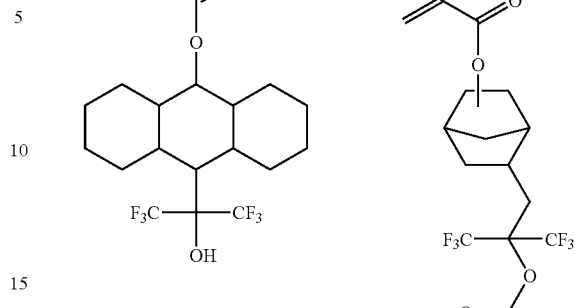
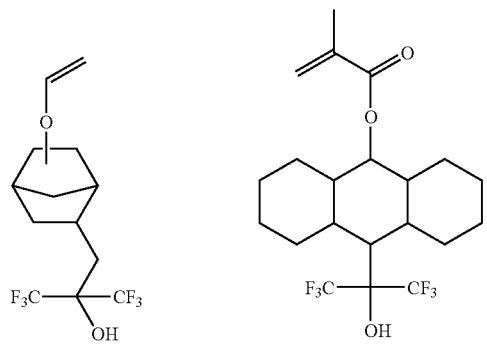
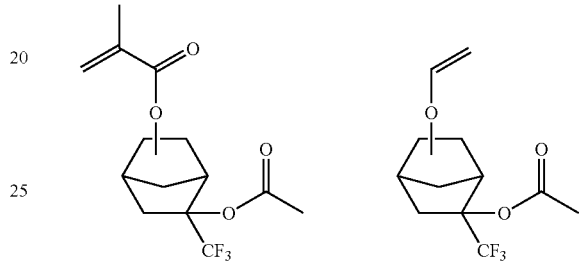
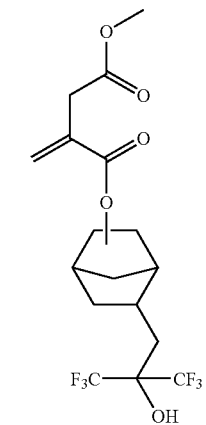
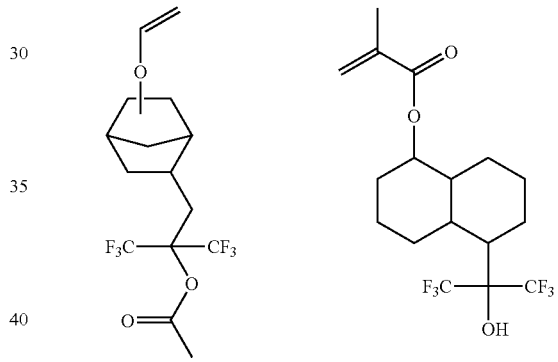
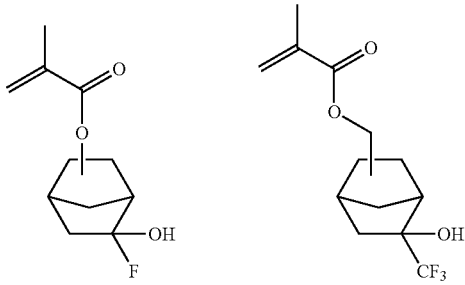
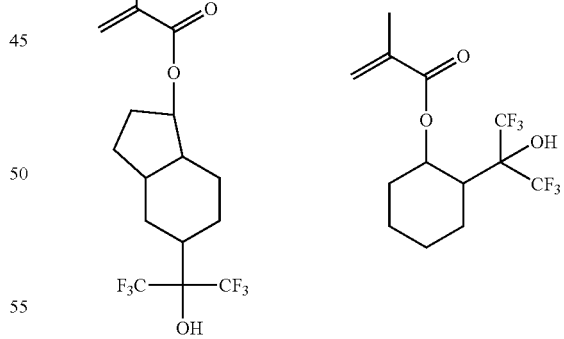
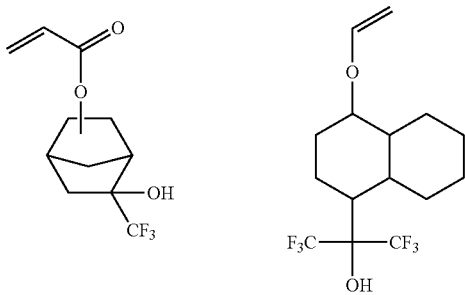
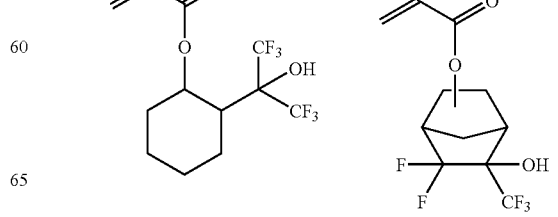

-continued
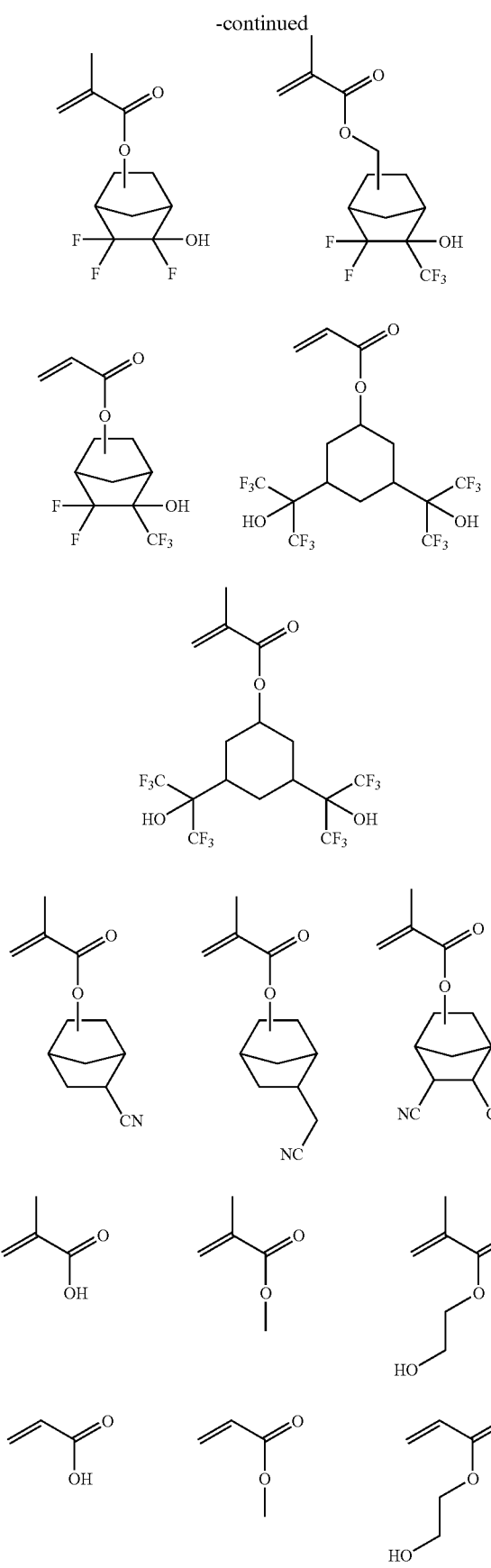
-continued
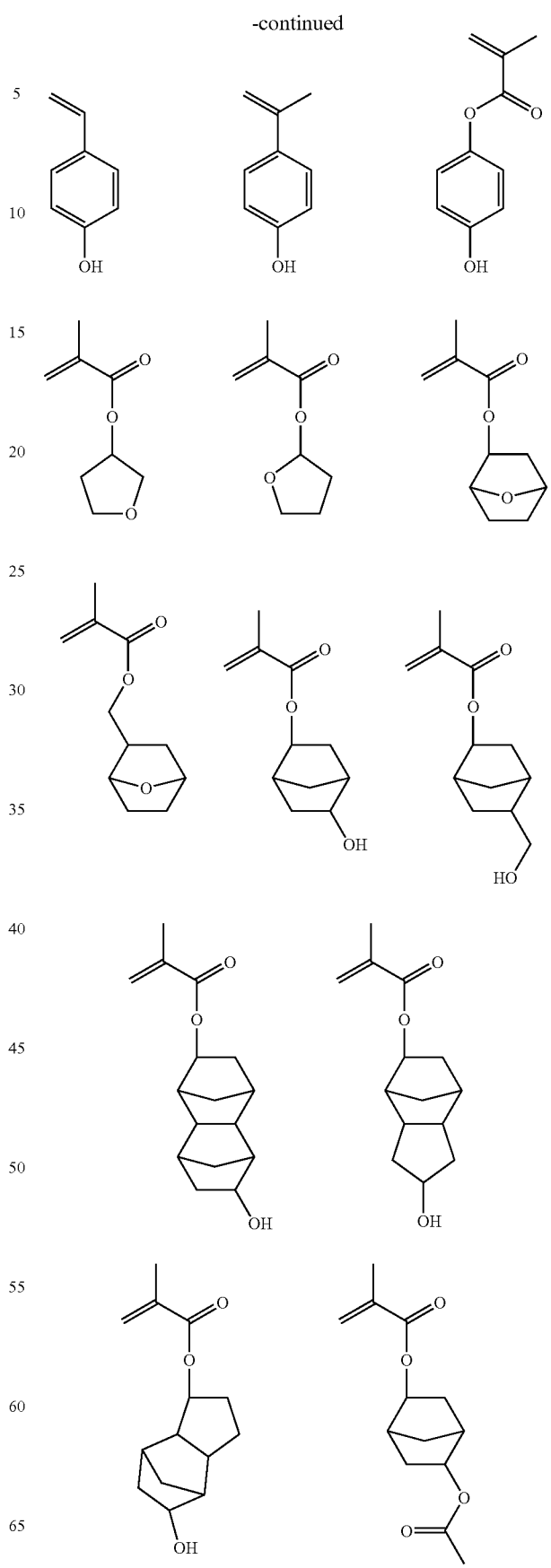

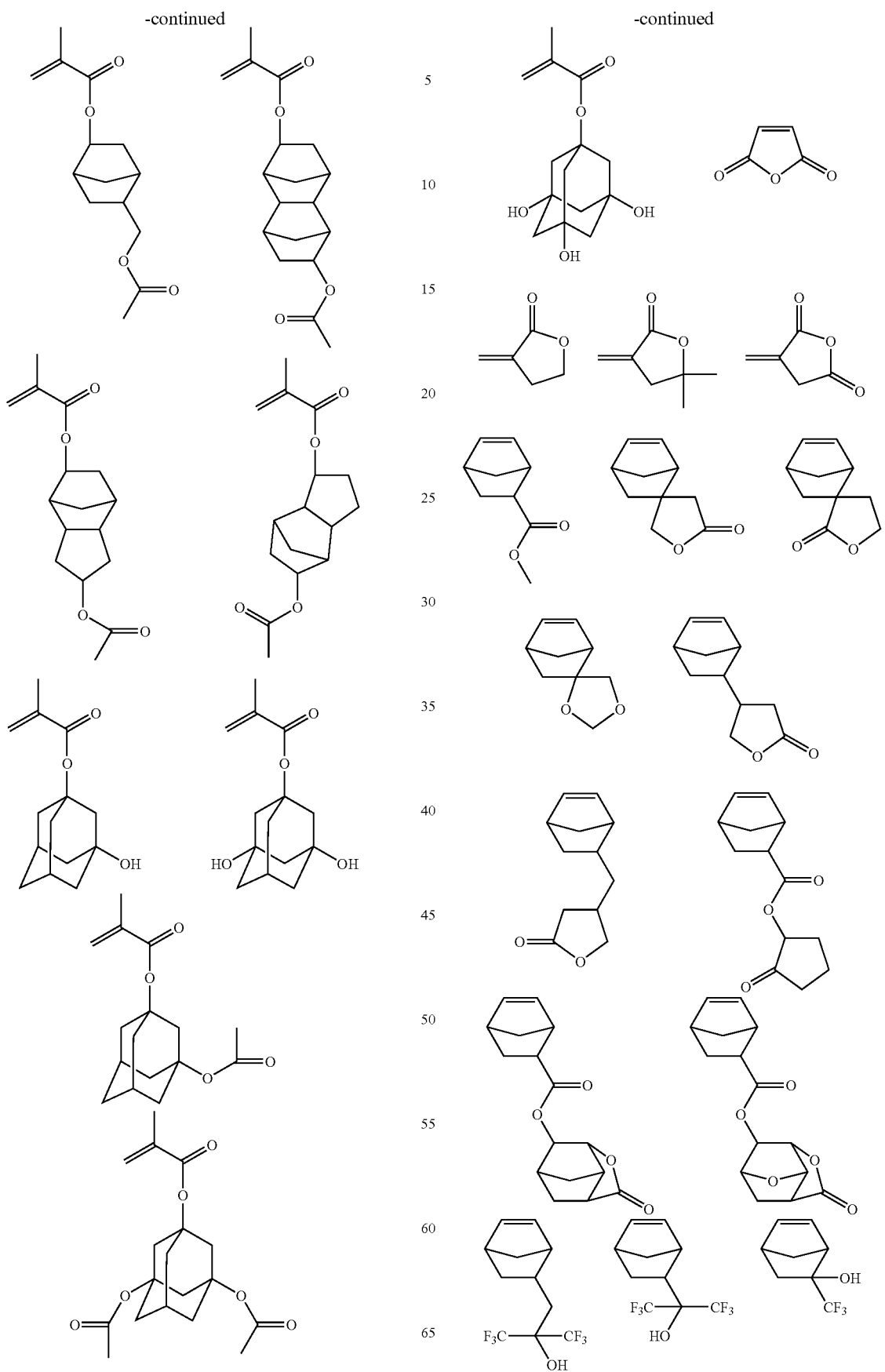

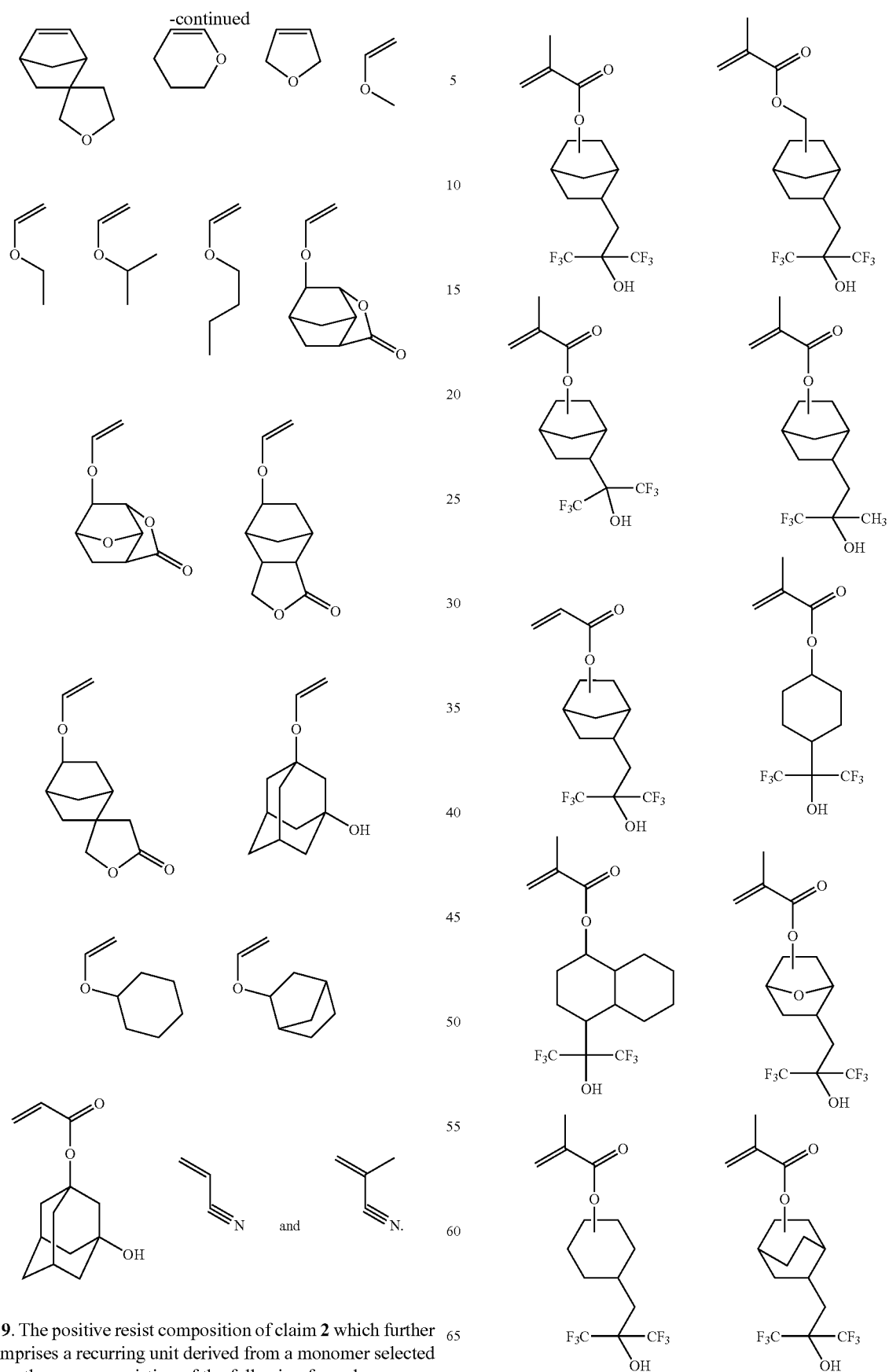
9. The positive resist composition of claim 2 which further comprises a recurring unit derived from a monomer selected from the group consisting of the following formulae:

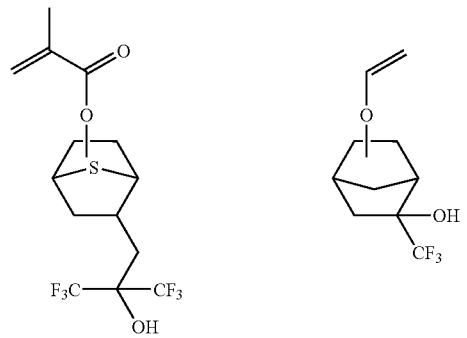
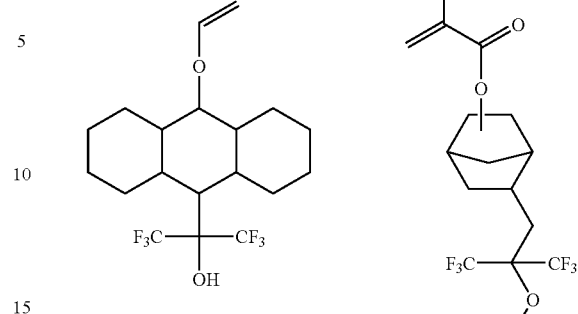
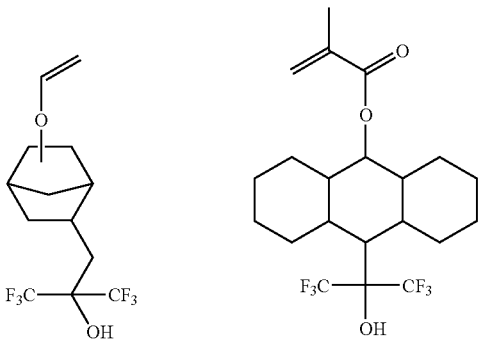
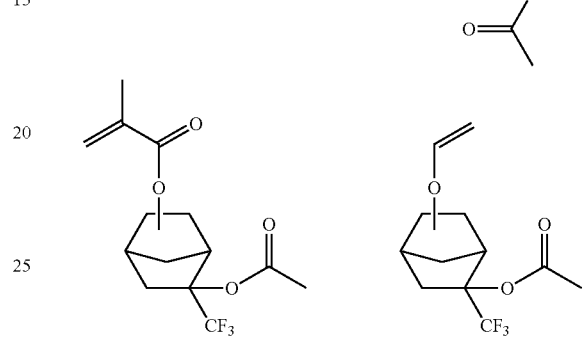
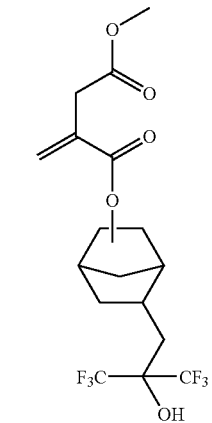
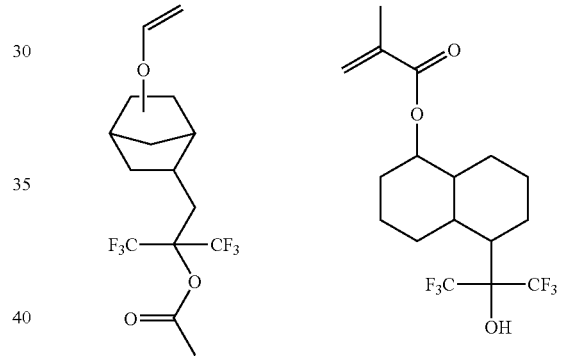
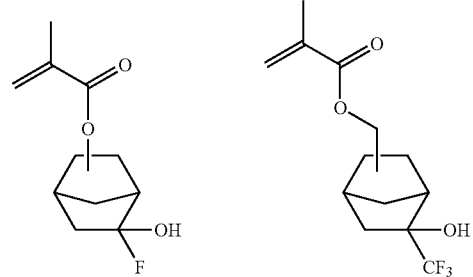
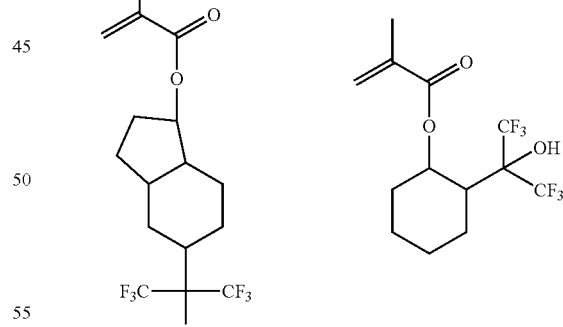
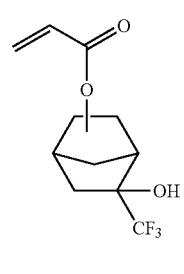
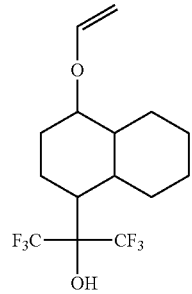
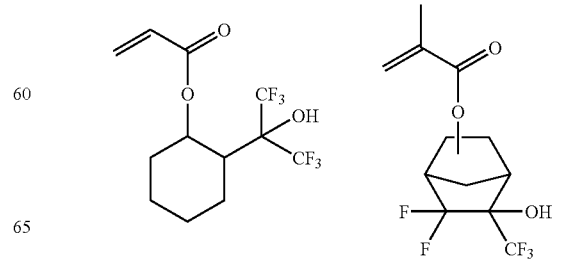
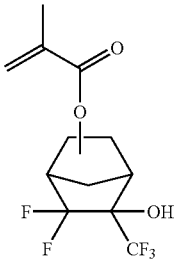

-continued
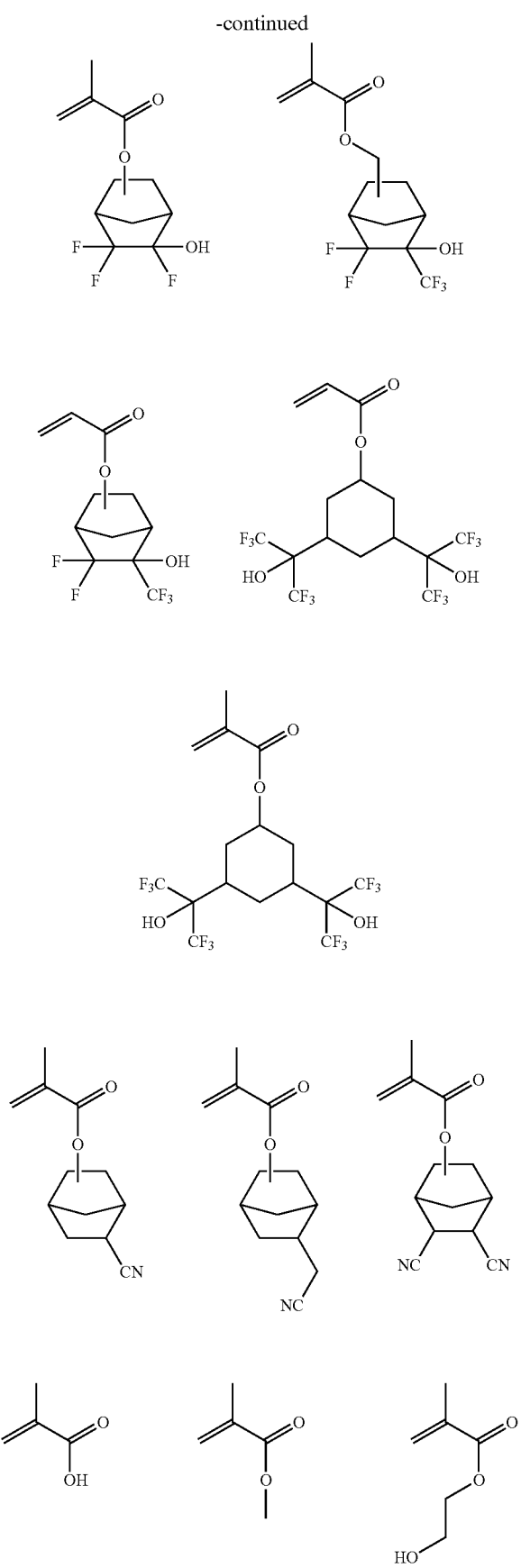
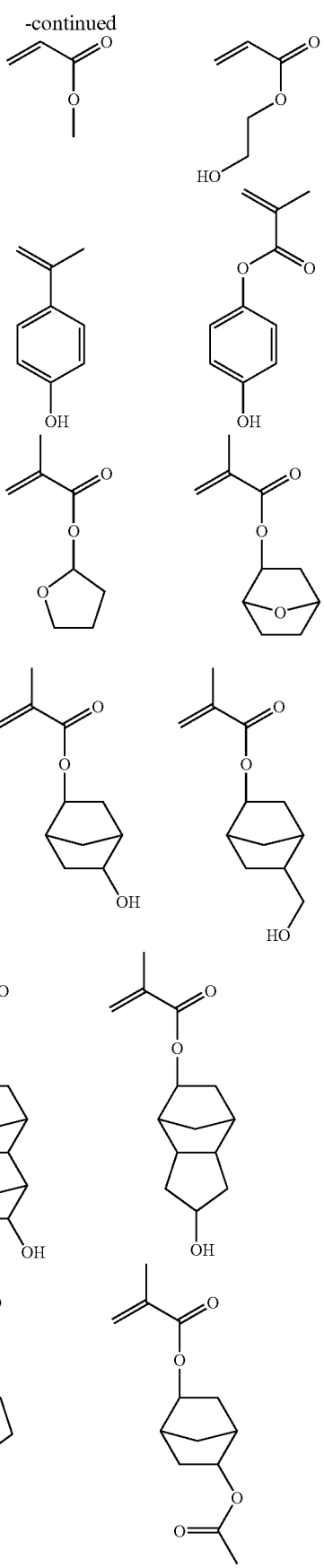

-continued
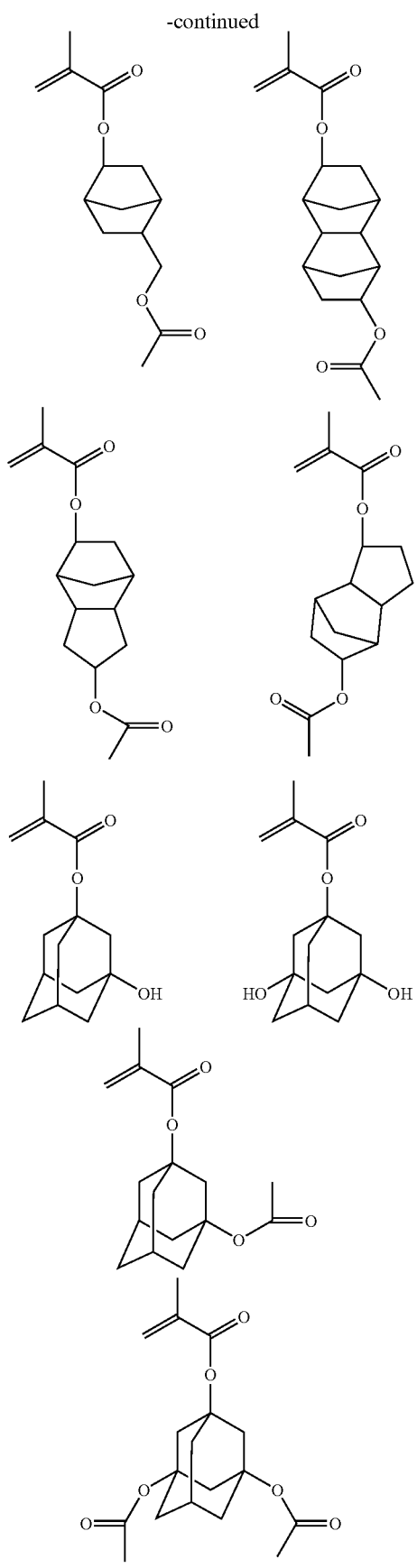
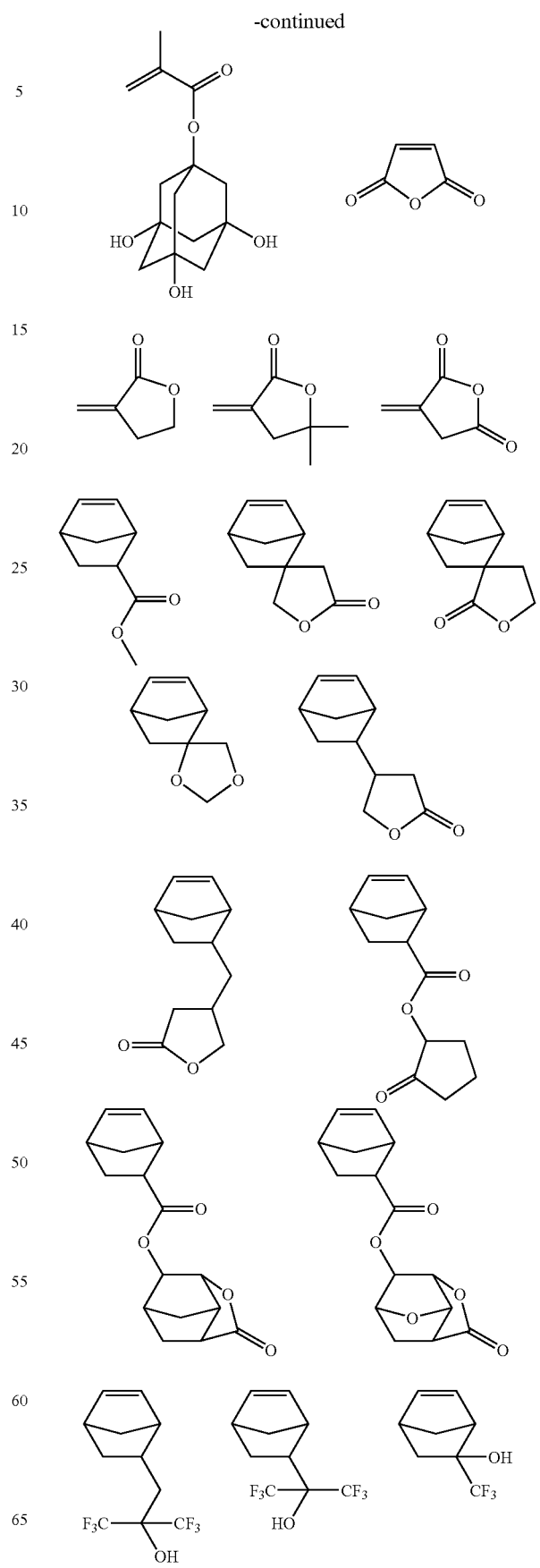

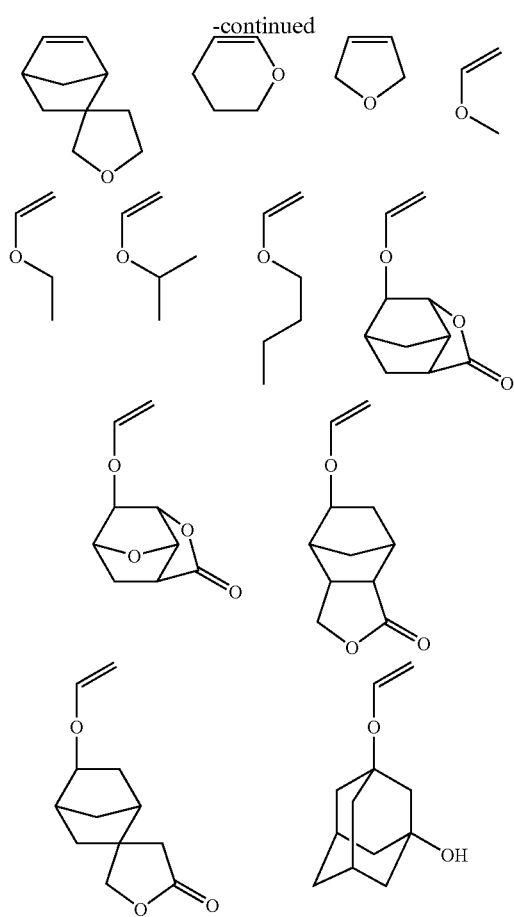
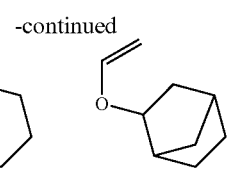
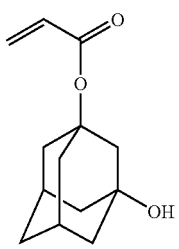
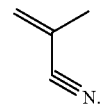

10. The positive resist composition of claim 2, further comprising an organic solvent and a photoacid generator, and serving as a chemically amplified resist composition.

11. The resist composition of claim 10, further comprising a dissolution inhibitor.

12. The resist composition of claim 10, further comprising a basic compound and/or a surfactant.

13. A process for forming a pattern comprising the steps of applying the resist composition of claim 2 onto a substrate, heat treating, exposing to high-energy radiation, and developing with a developer.

14. The pattern forming process of claim 13 wherein the high-energy radiation has a wavelength of up to 200 nm.

* * * * *